United States Patent
Chang-Hasnain et al.

(10) Patent No.: US 8,526,471 B2
(45) Date of Patent: Sep. 3, 2013

(54) HIGH CONTRAST GRATING BASED SATURABLE ABSORBER FOR MODE-LOCKED LASERS AND ITS APPLICATIONS IN PASSIVELY MODE-LOCKED VERTICAL-CAVITY SURFACE-EMITTING LASERS

(75) Inventors: Connie Chang-Hasnain, Palo Alto, CA (US); Weijian Yang, Berkeley, CA (US); Christopher Chase, Kensington, CA (US); Forrest G. Sedgwick, Berkley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/593,407

(22) Filed: Aug. 23, 2012

(65) Prior Publication Data

US 2013/0051410 A1     Feb. 28, 2013

Related U.S. Application Data

(63) Continuation of application No. PCT/US2011/026113, filed on Feb. 24, 2011.

(60) Provisional application No. 61/307,843, filed on Feb. 24, 2010.

(51) Int. Cl.
*H01S 3/113* (2006.01)
*H01S 3/098* (2006.01)
*G02B 5/18* (2006.01)

(52) U.S. Cl.
USPC ................................. 372/11; 372/18; 359/572

(58) Field of Classification Search
USPC ........................... 372/10, 11, 18, 19; 359/572
See application file for complete search history.

(56) References Cited

U.S. PATENT DOCUMENTS

2002/0028390 A1   3/2002   Mazed
2005/0207466 A1   9/2005   Glebov et al.

FOREIGN PATENT DOCUMENTS

WO       2007-041852 A1    4/2007

OTHER PUBLICATIONS

Korean Intellectual Property Office (KIPO), International Search Report and Written Opinion issued on Nov. 15, 2011(pp. 1-9), including claims searched (pp. 10-16), for related PCT International Patent Application PCT/US2011/026113, pp. 1-16.

*Primary Examiner* — Armando Rodriguez
(74) *Attorney, Agent, or Firm* — John P. O'Banion

(57) ABSTRACT

A saturable absorber (SA) based on a high-contrast grating (HCG) having a buried layer of quantum structures for absorption, and which is particularly well suited for use in a mode-locked application. The HCG-SA provides three times the bandwidth compared with traditional DBR structures, while exhibiting a lower saturation fluence due to the field enhancement inside the grating. Varying grating bar width over one or two axis provides lensing effects on the optical output, while chirping of the period and duty cycle changes optical phase relationships. Novel VCSEL embodiments with external or internal cavities are described using the HCG-SA.

45 Claims, 21 Drawing Sheets

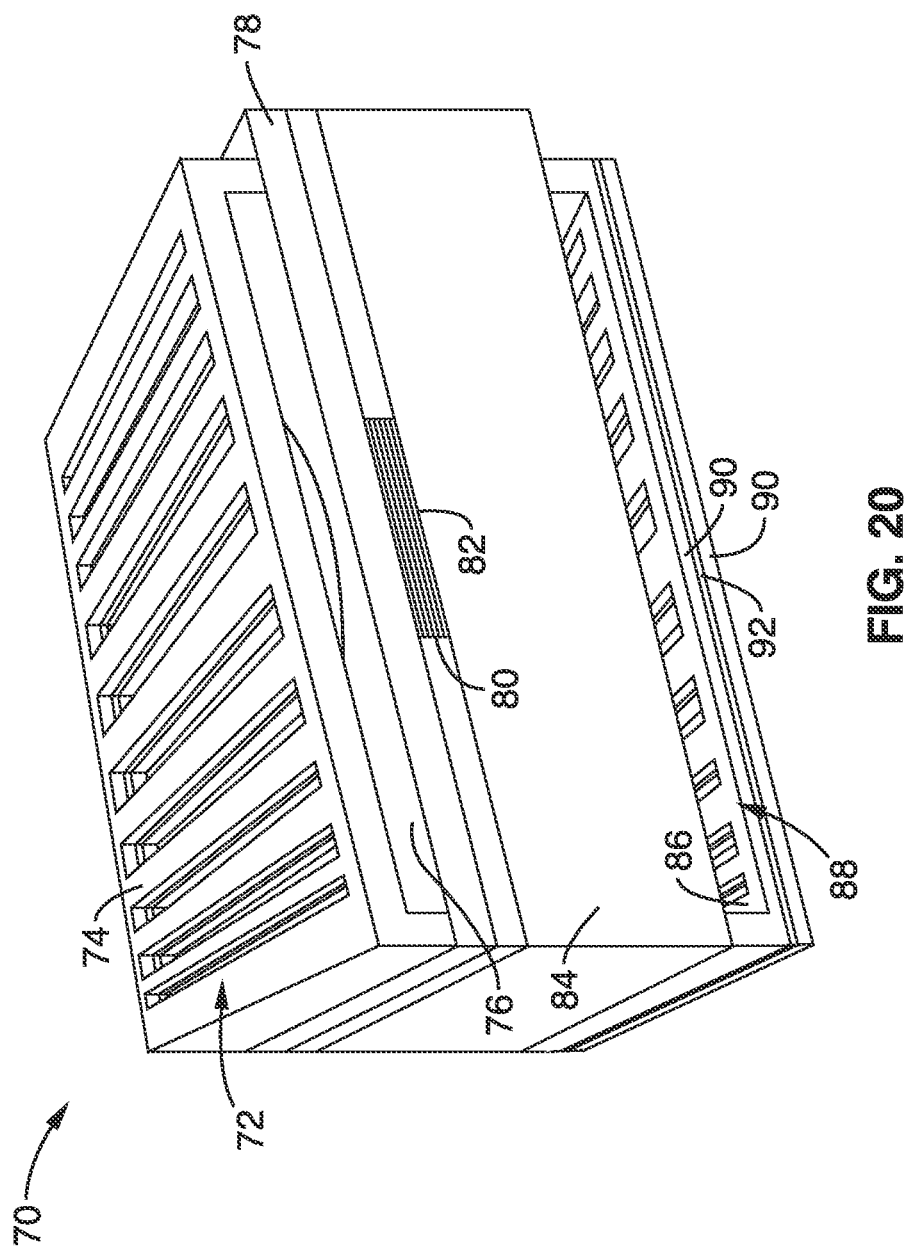

HIGH CONTRAST GRATING BASED SATURABLE ABSORBER FOR MODE-LOCKED LASERS AND ITS APPLICATIONS IN PASSIVELY MODE-LOCKED VERTICAL-CAVITY SURFACE-EMITTING LASERS

CROSS-REFERENCE TO RELATED APPLICATIONS

This application a 35 U.S.C. §111(a) continuation of PCT international application number PCT/US2011/026113 filed on Feb. 24, 2011, incorporated herein by reference in its entirety, which is a nonprovisional of U.S. provisional patent application Ser. No. 61/307,843 filed on Feb. 24, 2010, incorporated herein by reference in its entirety. Priority is claimed to each of the forgoing applications.

The above-referenced PCT international application was published as PCT International Publication No. WO 2011/106554 on Sep. 1, 2011 and republished on Jan. 5, 2012, and is incorporated herein by reference in its entirety.

STATEMENT REGARDING FEDERALLY SPONSORED RESEARCH OR DEVELOPMENT

This invention was made with Government support under Grant No. N00244-09-1-0013 awarded by the Department of Defense, and Grant No. Y503161 awarded by the National Science Foundation. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to saturable absorbers, and more particularly to an HCG-based saturable absorber and its applications.

2. Description of Related Art

A semiconductor saturable absorber mirror (SESAM) is a powerful device for generating femtosecond pulses in a mode-locked laser. Traditional SESAMs are built on top of a distributed Bragg reflector (DBR) structure which provides a broad reflection band. A SESAM is a mirror structure with an incorporated saturable absorber which is made using semiconductor fabrication technology. Typically, a SESAM contains a semiconductor Bragg mirror with quantum well absorber layers near the surface. The materials of the Bragg mirror within a SESAM have a larger bandgap energy, whereby essentially no absorption occurs in that region, and these devices are also referred to as saturable Bragg reflectors (SBRs). To obtain a large modulation depth, such as required for passive Q switching, a thicker absorber layer can be utilized, while a suitable passivation layer can be added over the top surface to increase device lifetime.

The absorption material often comprises bulk material, quantum wells (QWs) or quantum dots, with Gallium Arsenide (GaAs) and Aluminum Arsenide (AlAs) being typically utilized for the DBR structure. In response to the low index contrast between these two materials, a large number of pairs of material are required to provide a large high reflection bandwidth.

One of the limitations of SESAM is found in its saturation fluence, typically on the order of tens to hundreds $\mu J/cm^2$. As the repetition frequency of the mode-lock laser increases, the energy for each pulse decreases, requiring a lower saturation fluence to mode lock the laser. Several structures based on DBR solve this problem, however, this resolution is provided at the expense of reduced bandwidth.

Accordingly, there is a need of saturable absorbers having a high bandwidth. Saturable absorbers according to the present invention fulfill that need and provide lowered saturation fluence, and other beneficial attributes suitable to a number of applications.

BRIEF SUMMARY OF THE INVENTION

A High-Contrast Grating (HCG) based saturable absorber structure is taught which provides three times the bandwidth compared with traditional DBR structures, while exhibiting a lower saturation fluence due to the field enhancement inside the grating. The inventive absorber structure provides significant design flexibility for satisfying the requirement of different types of mode-lock lasers.

The HCG-based saturable absorber according to the invention comprises a subwavelength high-contrast grating of high index (e.g., greater than or equal to 2, or preferably 2.5, or more preferably 3), surrounded by a low index material (e.g., index of approximately one). The high-contrast grating comprises a cladding material incorporating at least one quantum structure layer (e.g., quantum well, wires and/or dots). It will be recognized that saturable absorption is a property of materials in which the absorption of light decreases with increasing light intensity. A number of materials show some evidence of saturable absorption, yet this only arises at very high optical intensities near the point of optical damage. When sufficient high incident light intensity is directed at the absorber, atoms in the ground state become excited into an upper energy state at a high rate, such that there is insufficient time for decay to occur back to the ground state before the ground state becomes depleted, accordingly the absorption subsequently saturates. Saturable absorbers are useful in a number of optical devices, and are particularly well-suited for use in laser cavities, and passive Q-switching. The key parameters for a saturable absorber are its wavelength range (where it absorbs), its dynamic response (how fast it recovers), and its saturation intensity and fluence (at what intensity or pulse energy it saturates).

The subwavelength high-index-contrast grating saturable absorber (HCG-SA) of the present invention provides a broadband reflector having a very high reflectivity for surface-normal incident light, and beneficial absorption characteristics. The broad high reflection band is due to the subwavelength dimensions of the grating bars and the high refractive index contrast between the bars and the surrounding material (e.g., air).

The HCG-based saturable absorber is well suited for a number of application areas, and is particularly well-suited for use in solid-state mode-locked lasers, femtosecond fiber lasers, as well as external-cavity mode-locked VCSELs. The external-cavity mode-locked Vertical Cavity Surface Emitting Lasers (VCSELs) are of special interest in view of their resultant compact design and low cost, although both an external lens and saturable absorber components may be necessary in many applications for achieving mode-locking. Mode-locked integrated external-cavity surface emitting lasers have been reported for simplifying the external cavity, however, the cost and complexity of this VCSEL design is often prohibitive.

The HCG-based saturable absorber can be configured to provide a lensing effect, whereby both an external lens and saturable absorber can be integrated into a single device, to simplify the laser cavity structure. In one embodiment of the invention, a monolithic electrically-pumped passively mode-locked VCSEL having both a saturable absorber and lensing effect are integrated into a long cavity VCSEL.

The invention is amenable to being embodied in a number of ways, including but not limited to the following descriptions.

One embodiment of the invention is an apparatus for providing a semiconductor saturable absorber mirror, comprising: (a) a high-contrast grating (HCG) having grating elements having an index of refraction at or exceeding approximately 2, and preferably greater than 2.5, or more preferably greater than 3, in which the high-contrast grating elements having subwavelength dimensions in grating element (bar) width and spacing; (b) a low index of refraction material (or materials) surrounding the grating elements; and (c) means for optical absorption, such as at least one layer of optically absorbing structures buried within each of the grating elements within the high-contrast grating.

At least one implementation of the invention is configured with optically absorbing structures that comprise any combination of quantum wells, wires or dots, and/or other absorption structures. At least one implementation of the invention is configured with optically absorbing structures which provide a reduced absorption of light with increasing incident light intensity. At least one implementation of the invention is configured with at least one layer of optically absorbing structures sandwiched between high index of refraction cladding layers within each of the grating elements. At least one implementation of the invention is configured with at least one layer of optically absorbing structures incorporated on the surface of the grating elements. At least one implementation of the invention is configured with grating elements which are periodically spaced. In at least one implementation of the invention the grating elements are configured of varying grating element width and/or spacing along their length and/or distribution direction to provide a lensing effect. In at least one implementation of the invention the semiconductor saturable absorber mirror is configured with "chirping" of the high-contrast grating elements by varying grating element width and/or spacing along a distribution direction of the high-contrast grating elements to provide varying phase changes along a length of the high-contrast grating.

At least one implementation of the invention is configured so that the semiconductor saturable absorber provides increased bandwidth in comparison with saturable distributed Bragg reflector (DBR) structures. At least one implementation of the invention is configured with the optically absorbing layer inside the high-contrast grating of the semiconductor saturable absorber mirror configured for overlapping areas having an electrical field yielding a desired saturation fluence, at which pulse energy the absorption saturates. At least one implementation of the invention is configured with the optically absorbing layer inside the high-contrast grating configured to overlap areas having the highest electrical field and associated saturation fluence, to reduce the pulse energy at a pulse energy that the absorption saturates. Field enhancement inside the high-contrast grating of the semiconductor saturable absorber mirror can be configured to a value up to approximately eleven (11), which exceeds field enhancement in a classical DBR-SA by over approximately one order of magnitude. The three physical parameters controlling reflectivity of the grating, include period ($\Lambda$), thickness ($t_g$), and duty cycle ($\eta$); and in which duty cycle is defined as a ratio between width of the high index material (s) to its period ($\Lambda$).

At least one implementation of the invention is configured with said saturable absorber mirror comprising a mirror within a laser, such as within a laser configured for generating short optical pulses. At least one implementation of the invention has the saturable absorber mirror configured as a transmissive component within a laser, such as a laser configured for generating short optical pulses. At least one implementation of the invention is configured with the saturable absorber mirror configured as a reflection mirror within a vertical cavity surface emitting laser (VCSEL). At least one implementation of the invention is configured with the semiconductor saturable absorber mirror as an integrated mirror (e.g., bottom or top) within a passively mode-locked vertical cavity surface emitting laser (VCSEL). In at least one implementation of the invention the VCSEL is electrically-pumped.

One embodiment of the invention is an external cavity mode-locked vertical-cavity surface-emitting laser apparatus, comprising: (a) a high-contrast grating saturable absorber (HCG-SA) having grating elements with subwavelength dimensions of grating element width and spacing, of a material having an index of refraction at or exceeding approximately two, or in more preferred embodiments toward 2.5 or more preferably greater than three; (b) a low index of refraction material (or materials) surrounding the grating elements, and in which the HCG-SA has a high index of refraction cladding surrounding at least one optically absorbing layer; (c) a semiconductor active structure disposed in separation from the high-contrast grating saturable absorber, wherein the separation forms part of a vertical cavity; (d) an active region within the vertical cavity surface emitting laser upon which a lens effect of the HCG-SA is focused; and (e) a bottom mirror positioned beneath the active region.

At least one implementation of the invention is configured with grating elements of varying width and/or spacing along their length and/or distribution direction to provide a lensing effect. At least one implementation of the invention is configured so that the optically absorbing layer within the HCG-SA absorbs light from the active region within the vertical cavity surface emitting laser (VCSEL). At least one implementation of the invention is configured within a mode-locked vertical-cavity surface-emitting laser in which the bottom mirror comprises a multiple layer distributed Bragg reflector (n-DBR). In at least one implementation of the invention, the bottom mirror comprises another high-contrast grating (HCG). In at least one implementation of the invention external cavity length changes in response to changing the distance of the separation to support different repetition rates of the mode-locked vertical cavity surface emitting laser (VCSEL).

In at least one implementation of the invention the optically absorbing layers comprise any combination of quantum well and/or quantum dots. In at least one implementation of the invention at least one layer of optically absorbing layers are incorporated between high index of refraction cladding layers within each of the grating elements. In at least one implementation of the invention at least one optically absorbing layer is incorporated on the surface of said grating elements. In at least one implementation of the invention further comprises chirping of the high-contrast grating elements by varying grating period along a distribution direction of the high-contrast grating elements to provide varying phase changes along a length of the high-contrast grating. The semiconductor saturable absorber provides increased bandwidth in comparison with saturable Distributed Bragg Reflector (DBR) structures. In at least one implementation of the invention field enhancement inside the high-contrast grating of the semiconductor saturable absorber mirror can be configured to a value up to approximately eleven (11), which exceeds field enhancement in a classical DBR-SA by over one order of magnitude.

In at least one implementation of the invention the optically absorbing layer inside the high-contrast grating of the semiconductor saturable absorber mirror is configured to overlap areas which have an electrical field yielding a desired saturation fluence, at which pulse energy absorption is saturated. In at least one implementation of the invention the optically absorbing layer inside the high-contrast grating of the semiconductor saturable absorber mirror is configured to overlap areas of highest electrical field to reduce associated saturation fluence, at which pulse energy absorption is saturated.

One embodiment of the invention is a monolithic passively mode-locked vertical cavity surface emitting laser (VCSEL) apparatus, comprising: (a) a top output mirror; (b) an active region of a vertical cavity surface emitting laser disposed in separation below a low refractive index material (or materials) which is proximal the top output mirror; (c) a bottom mirror positioned beneath the active region and comprising a high-contrast grating saturable absorber (HCG-SA) having grating elements with subwavelength dimensions in width and/or spacing in a material having an index of refraction at or exceeding approximately 2, and preferably greater than 2.5, or more preferably greater than 3; (d) at least one optically absorbing structure layer within the HCG-SA surrounded by high index of refraction cladding, in which the top mirror, bottom mirror, active layer, and low index of refraction material are fabricated into a monolithic VCSEL structure having an internal cavity.

The present invention provides a number of beneficial elements which can be implemented either separately or in any desired combination without departing from the present teachings.

An element of the invention is a high-contrast grating (HCG) based saturable absorber (SA) which provides a high bandwidth reflector with high reflectivity.

Another element of the invention is an HCG-SA having grating elements of varying widths along one or two axis of the grating to provide lensing effect.

Another element of the invention is an HCG-SA having a chirped period and duty cycle of the grating to provide differing phase changes.

Another element of the invention is an external cavity mode locked VCSEL based on the HCG-SA.

Another element of the invention is a monolithic electrically-pumped passively mode-locked VCSEL having an HCG top mirror and HCG-SA as the bottom reflector.

Further elements of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 20 is a schematic of a monolithic passively mode-locked VCSEL according to an embodiment of the present invention.

DETAILED DESCRIPTION OF THE INVENTION

1. Theoretical Analysis of Grating Reflectivity.

The following sections provide an analysis of grating reflectivity that will aid in understanding the techniques and embodiments of the present invention. For the sake of simplicity the analysis is limited to the case of surface-normal incidence and a rectangular profile of refractive index, although the inventive aspects are not limited in this regard.

Figure 1:
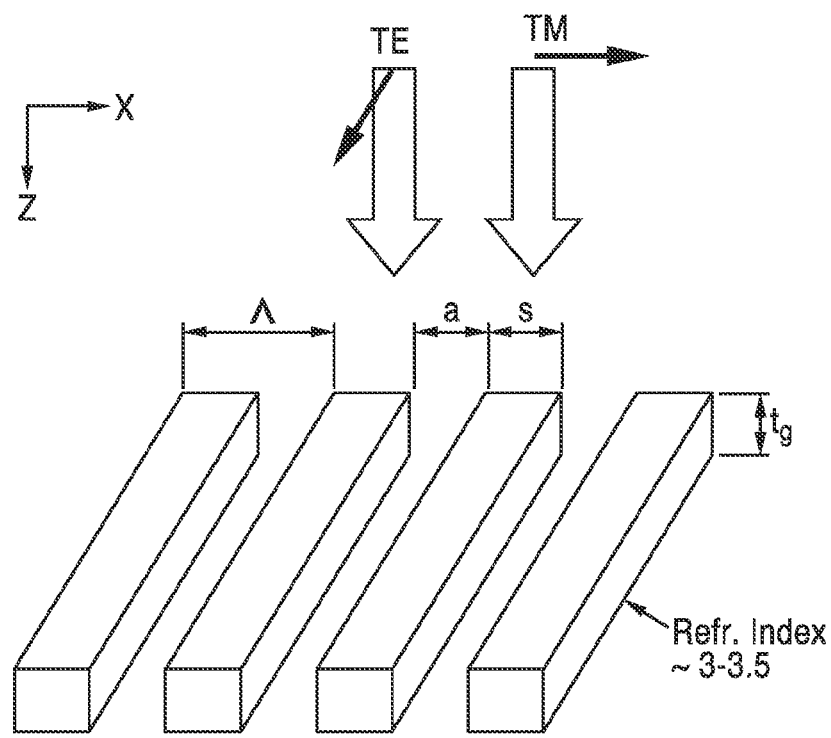
FIG. 1 is a schematic of a high-contrast grating, showing incident optical waves in two different polarizations.

FIG. 1 depicts geometry for a High Contrast Grating (HCG), shown with upper outline arrows indicating the wave incidence direction, and from which the medium size arrows are shown in relation thereto representing E-field direction illustrating both Transverse-Magnetic (TM) and Transverse Electric (TE) polarizations. The period ($\Lambda$) of the gratings is shown in the figure, along with bar width (s), thickness ($t_g$), and air-gap (a).

The parallel bars represent a dielectric material with a refractive index ($\eta_r$), which is significantly higher than the refractive index of the surrounding medium, wherefrom the phrase arises "High Contrast" Grating. The typical refractive index of the high-index grating bars is 3~3.5, and the outside medium is assumed to be a low refractive material or air ($\eta_r=1$). It should be appreciated that numerous low index media exist (e.g., oxides), which provide comparable effects and refractive indices which are less than two (2), and more preferably approximately one (1). The grating periodicity direction is depicted as x, with the incident plane wave propagation direction depicted as z indicated by the large upper arrows. For simplicity, the length of each grating bar is assumed to be infinite in y direction (coming out of the page) and infinitely periodic in x direction.

Two polarizations are considered in the analysis: (i) Transverse-Magnetic (TM), in which the electric field is in the x direction; (ii) Transverse Electric (TE), in which the electric field is in y direction. Both polarizations are represented in the figure which are labeled and superposed over the wave incidence direction.

Figure 2:
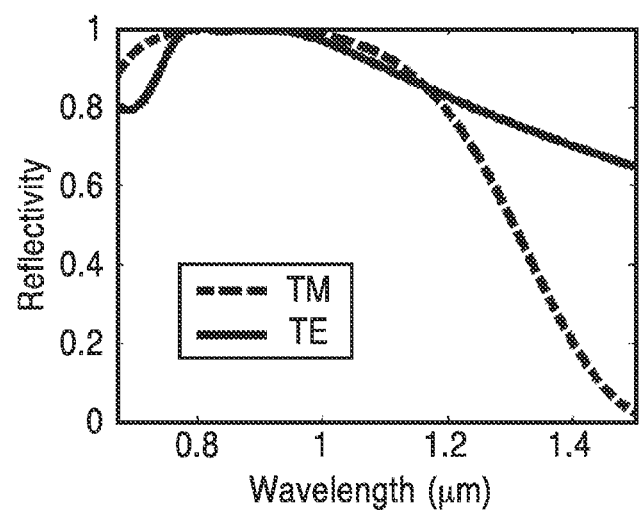
FIG. 2 is a graph of reflectivity as a function of wavelength for the two polarization directions.

FIG. 2 depicts an example of the broad-band high reflectivity provided by the HCG structure for both polarizations. By way of example, the parameters for TM polarization for this specific embodiment are: $\eta_r=3.21$, $\Lambda=0.44$ μm, $s/\Lambda=0.77$, $t_g=0.29$ μm. The parameters for use with a specific embodiment having TE polarization are: $\eta_r=3.3$, $\Lambda=0.64$ μm, $s/\Lambda=0.38$, $t_g=0.14$ μm.

Figure 3:
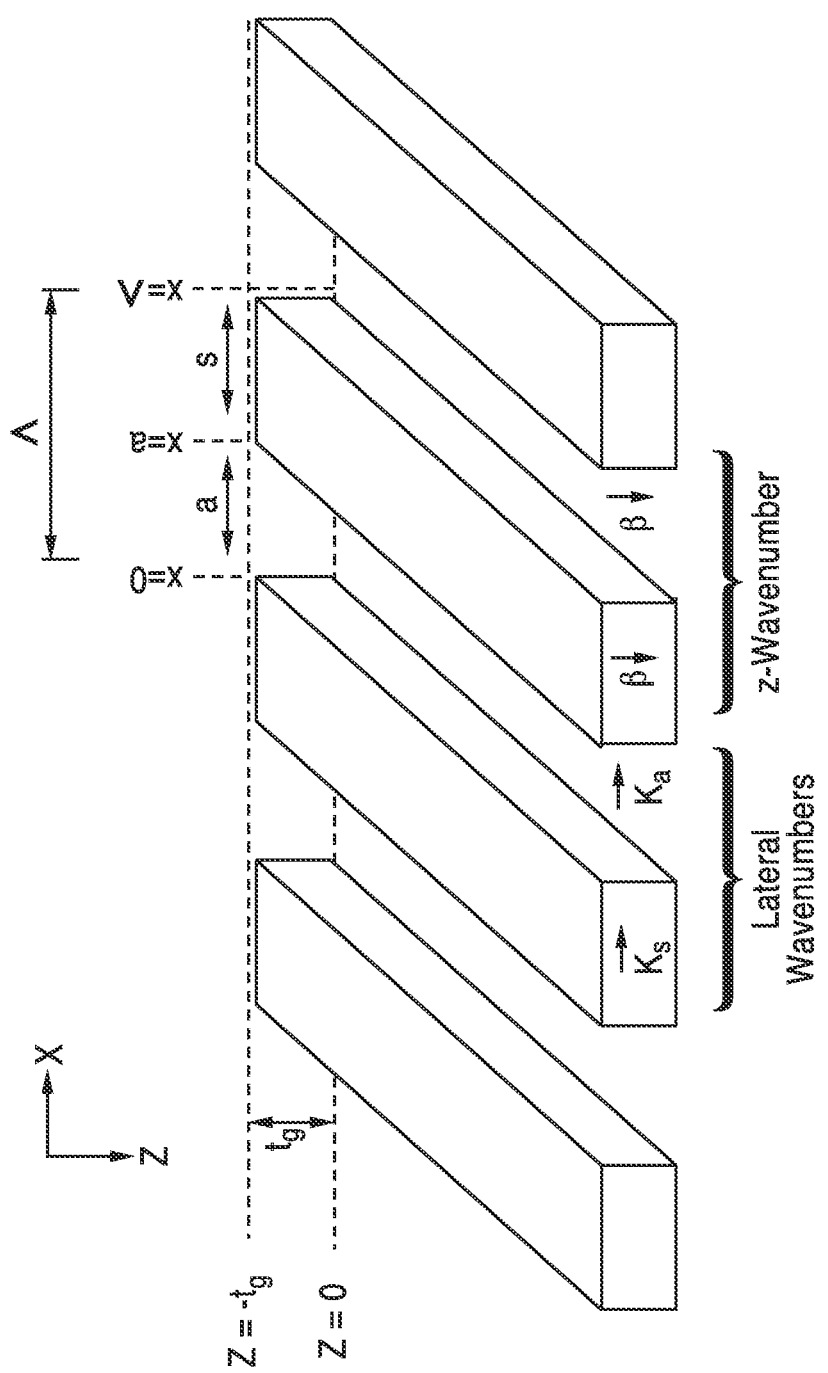
FIG. 3 is a schematic of a high-contrast grating, showing lateral and z wavenumbers in relation to grating dimensions.
Figure 4:
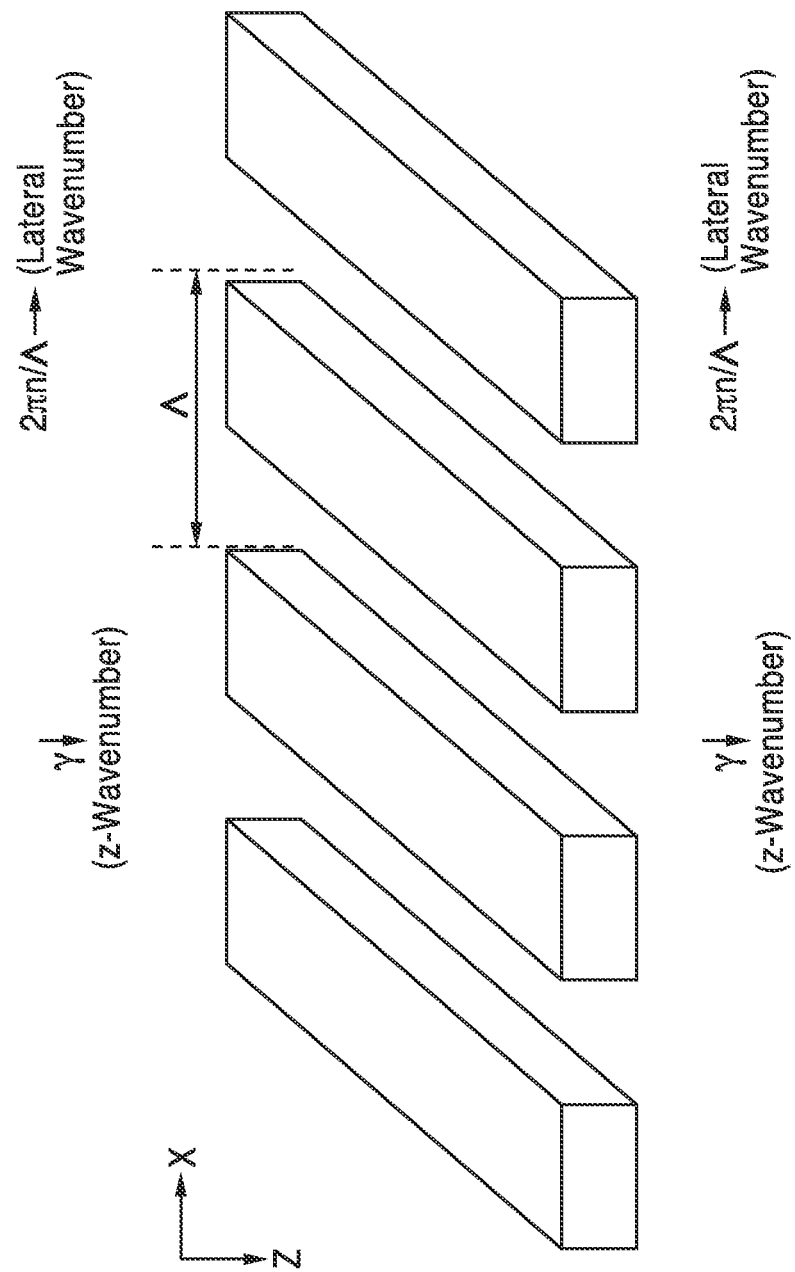
FIG. 4 is a schematic of a high-contrast grating, showing lateral and z wavenumbers in relation to grating period.

FIG. 3 and FIG. 4 depict gratings with reference indicia describing the nomenclature for all wavenumbers, axes and dimensions, and referring to mode formulations both inside and outside of the high-contrast grating (HCG). Lateral and z-wavenumbers are seen depicted in the figures along with period, grating thickness and other parameters.

Upon wave incidence, reflected and transmitted modes are generated at the grating, the lowest of which are plane waves. These elements are described in Table 1, at the end of the specification, along with their associated mathematical formulations. The mode profiles in Eq. 1 and Eq. 2 of Table 1 describe the lateral (x) field components: electric field $E_x$ in the TM case, and magnetic field $H_x$ in the TE case. The formulation of the y and z field components are not described herein, as they can be readily derived from the x components. Since the HCG is considered infinite in y direction and the incidence is surface normal, the solution described in Table 1 is two-dimensional ($\delta/\delta y$). In addition, the solution is described for only one HCG period ($0<x<\Lambda$), since all modes are periodic in x direction. As the plane wave incidence is surface normal, there is no preferred direction among +x and −x, wherefore modes in Eqs. 1, 2, 4 and 5, have a standing wave (cosine) lateral profile. Eq. 1 and Eq. 2 show that the mode profiles have two sets of symmetry planes: each air-gap center ($x=a/2$) and each grating bar center ($x=a+s/2$). The same is of course true for the modes outside HCG, seen in Eq. 4 and Eq. 5. While the symmetry plane ($x=a/2$) outside HCG is obvious from Eq. 4 and Eq. 5, the following identity helps to demonstrate that ($x=a+s/2$) is a symmetry plane as well:

$$\cos[2\pi n(x-a/2)/\Lambda] = (-1)^n \cos\{2\pi n[x-(a+s/2)]/\Lambda\}.$$

The lateral symmetry in Eq. 1 and Eq. 2 and Eq. 4 and Eq. 5 is even (cosine) rather than odd (sine), because the incident plane wave has a laterally constant profile, and thus it can only excite cosine harmonics.

In Eq. 6 through Eq. 9 of Table 1 and Table 2 the dispersion relations are listed between the different wave numbers, while Eq. 9 describes the x-wavenumbers outside the grating ($\gamma_n$). Eq. 9 shows that the HCG, as expected, has only the zeroeth diffraction order: $\gamma_0=2\pi/\lambda$, while all higher orders are evanescent ($\gamma_n$ is imaginary), since HCG is subwavelength ($\Lambda/\lambda<1$). This fact is essential for the design of high reflectivity gratings, since high reflectivity is achieved by cancelling the zeroeth-transmissive order. It should be appreciated that higher evanescent orders do not carry power and thus do not require cancellation. Had there been more than one transmissive order, it would not be possible to obtain a high reflectivity grating.

Figure 5:
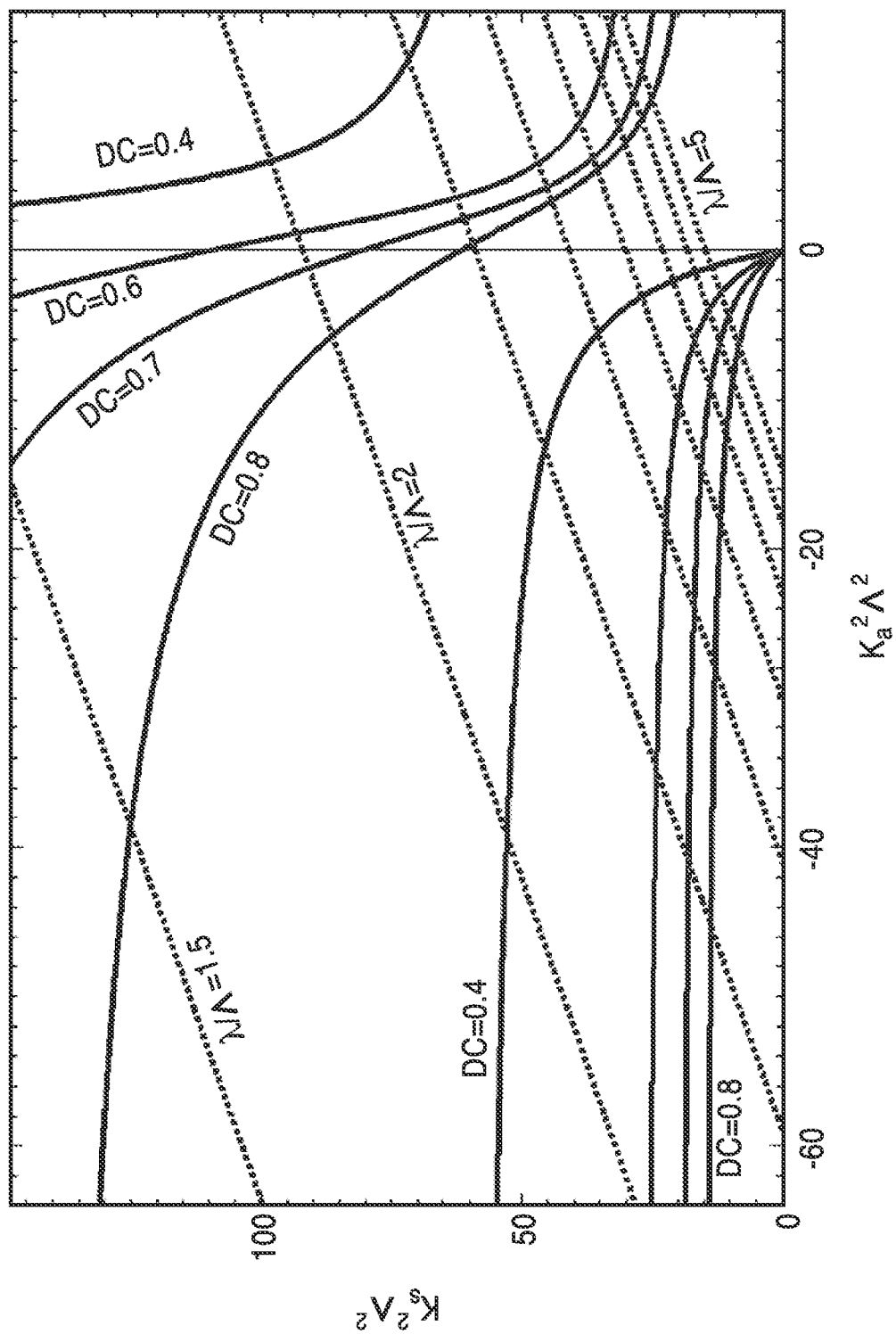
FIG. 5 is a graph of dispersion for an HCG with a given refractive index.

FIG. 5 depicts the dispersion relations for Eq. 6 through Eq. 8 in Table 1 for various grating duty cycles (DC), defined as $DC=s/\Lambda$, shown as $DC=0.4$, 0.5, 0.6, 0.7 and 0.8. These dispersion relations are shown for an HCG with a refractive index $n_r=3.21$, assuming TM polarization. Lower and upper curves represent the first two branches of Eq. 8. The intersection between the linear lines and the transcendental curves denote the x-wavenumbers of each mode. The linear lines in the figure correspond to subtracting Eq. 7 from Eq. 6. It will be seen that at large wavelengths ($\lambda\gg\Lambda$) the lowest harmonic resembles a plane wave $k_s\approx k_a\approx 0$, since at large wavelengths the exact grating profile loses effect, and the grating behaves as a uniform layer with an effective refractive index.

The figure shows that inside the grating bars all modes have real wavenumbers $k_s$, while inside the air-gaps the lowest mode has an imaginary wavenumber $k_a$ and the higher modes have either imaginary or real $k_a$, depending on wavelength. Another intuitive observation from FIG. 5 is that at large wavelengths ($\lambda\gg\Lambda$) the lowest harmonic resembles a plane wave ($k_s\approx k_a\approx 0$), since at large wavelengths the exact grating profile loses effect, and the grating behaves as a uniform layer with an effective refractive index.

Based on the mode profiles of Table 1, the calculation of the HCG reflectivity is shown in Table 2. The method adopted in Table 2 borrows the reflection coefficient calculations of transmission lines, with the significant difference that in the multi-mode case of HCG, matrices replace scalars. The solution in Table 2 depends entirely on overlaps between mode profiles inside the HCG (Eq. 1 and Eq. 2) and those outside the HCG (Eq. 3 through Eq. 5). Initially, two unit-less matrices are defined: the E and H matrices respectively indicate the overlaps between the electric field profiles inside and outside HCG and the magnetic field profiles. This definition of E and H is insightful, since the entire HCG solution can be based on those two matrices.

As a second step, an intuitive expression is used in Eq. 12 to calculate the reflection matrix $\rho$, which describes the bouncing of the HCG modes from the HCG output planes (i.e., $z=0$ and $z=-t_g$) back into the grating. This reflection matrix is typically non-diagonal, which means that the modes couple into each other during the back-bouncing. This does not contradict the orthogonality of the modes inside HCG, since the back-bouncing involves interaction with the modes outside HCG, which are not orthogonal to the modes inside the HCG.

In regular transmission lines, the reflectivity calculation is also based on the accumulated phase, which is represented herein by the phase matrix $\phi$, defined in Eq. 13, as a diagonal matrix comprising individual phases of each mode. Having defined the reflection and the phase matrices, which are the matrix analogies of the corresponding scalars in transmission line theory, the transmission line solution steps are followed to define the (normalized) entrance impedance matrix of the HCG, $Z_{in}$, as shown in Eq. 14. Then by knowing $Z_{in}$, the reflectivity matrix R of the HCG is calculated by Eq. 15, whereby the coefficient of interest is $R_{00}$, which is the reflectivity of the incident plane-wave.

Figure 6:
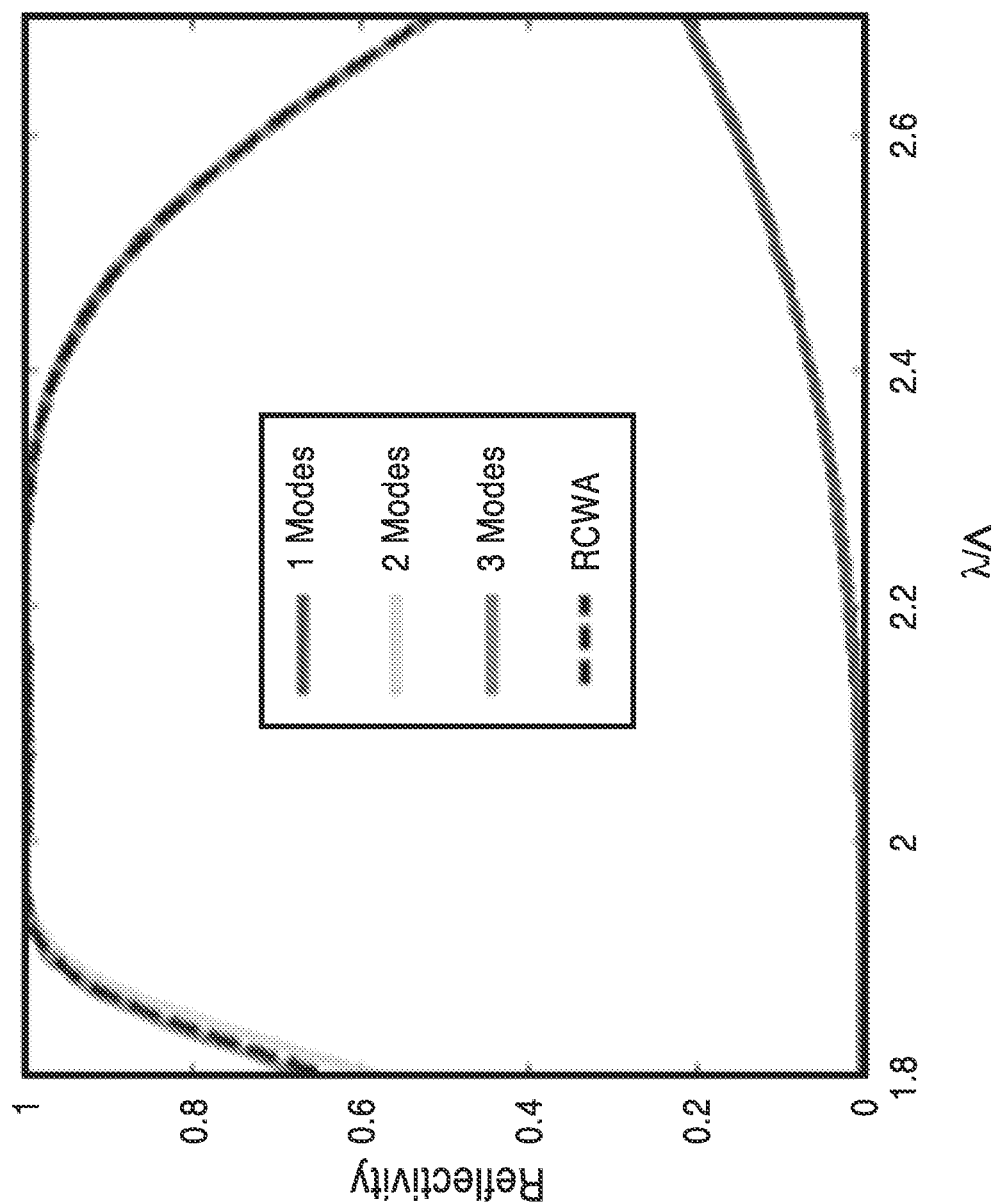
FIG. 6 is a graph of convergence of the analytical solution found in Tables 1 and 2 towards the RCWA simulation.
Figures 7A, 7B, 7C, 7D, 7E:
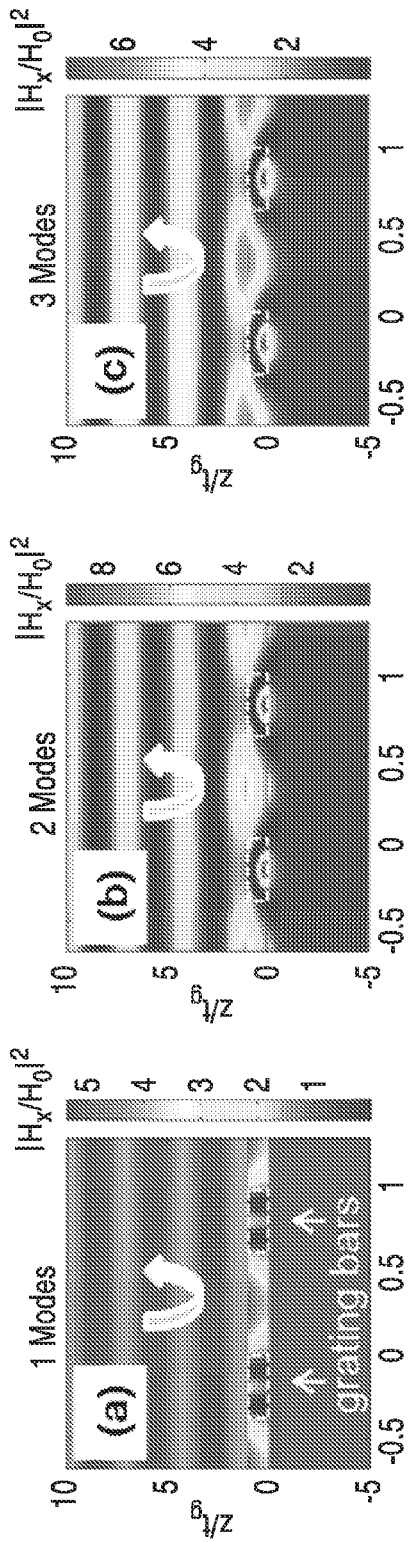
FIG. 7A through FIG. 7E are intensity profiles showing convergence as a function of the number of modes.
Figure 8B:
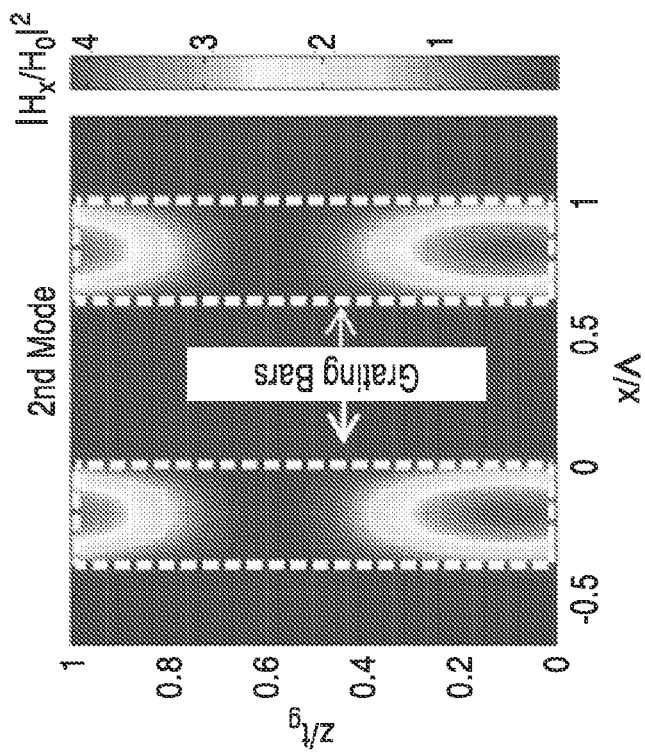
FIG. 8A through FIG. 8D are contour plots of modes within the HCG.
Figure 8A:
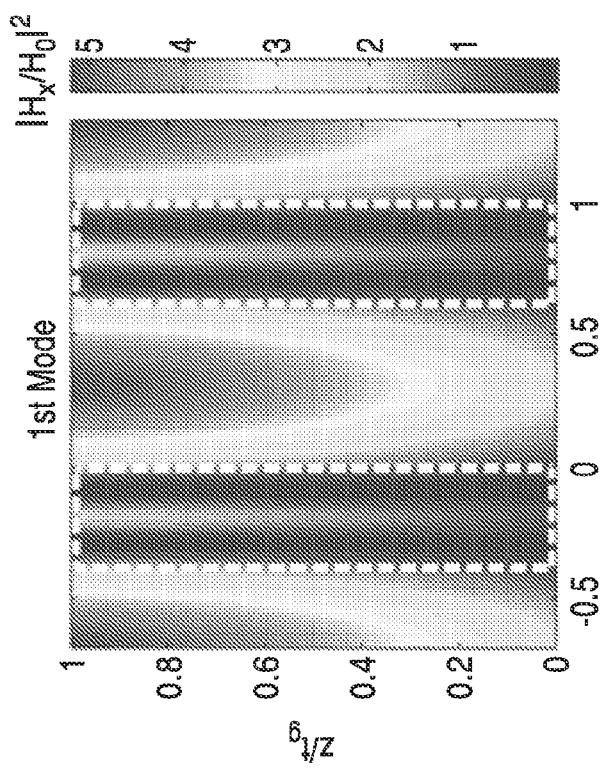
Figure 8D:
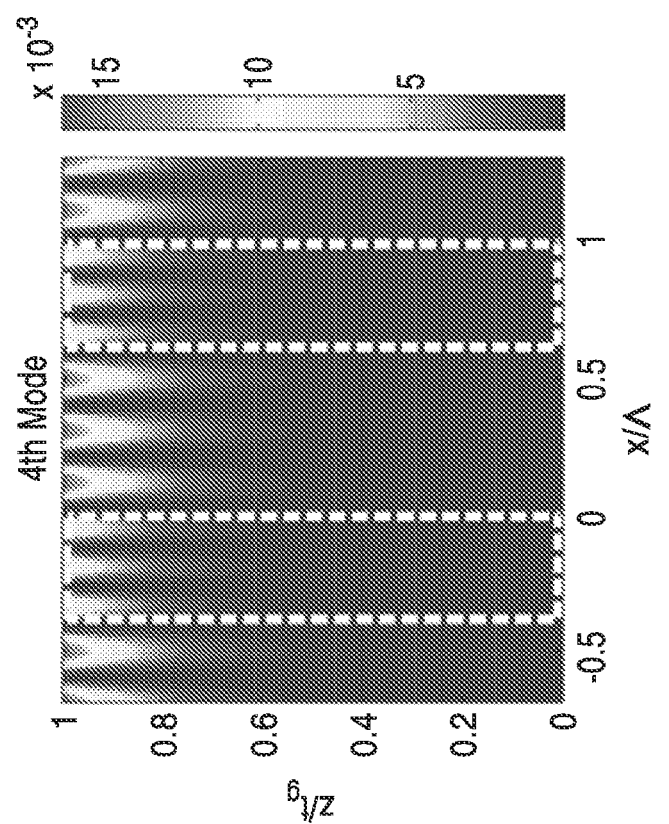
Figure 8C:
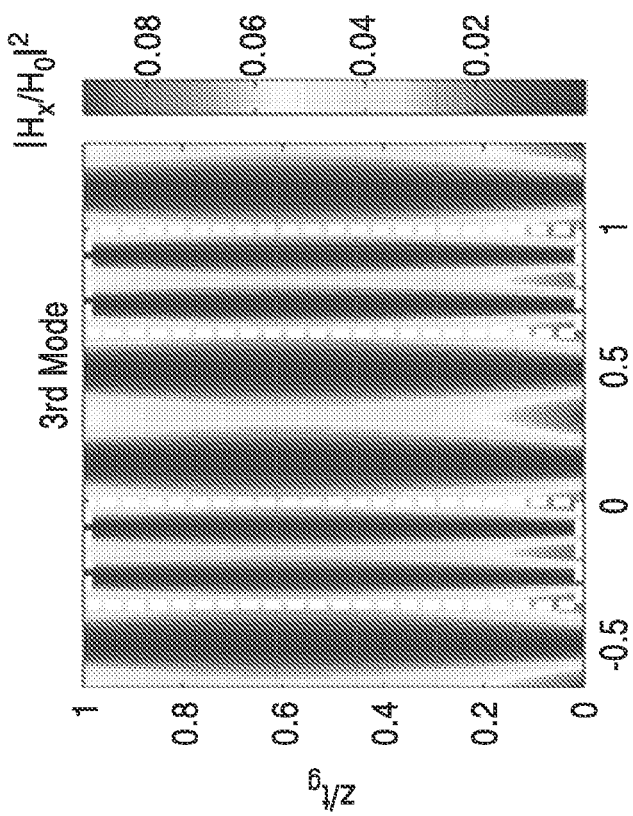

FIG. 6 depicts convergence of the analytical solution in Table 1 and Table 2 towards the Rigorous Coupled Wave Analysis (RCWA) simulation result as a function of the number of modes taken into consideration for TE polarization. Due to the inherent multimode nature of the HCG, the single mode solution is far from the RCWA result, but as soon as at least one more mode is added, the convergence becomes almost perfect as seen in the figure.

The next step is to determine how many modes in Table 1 and Table 2 are actually required to obtain the desired precision, in particular the rate at which the solution converges. A clear conclusion from FIG. 6 is that the two lowest modes are already sufficient to describe reflectivity with very high precision. However, a solution based on only one mode generates a result, which has nothing in common with the final solution. This agrees with the underlying principle of this work, which is the multi-mode nature of the HCG. A further examination of solution convergence is described below.

FIG. 7A through FIG. 7E depict convergence with respect to intensity profiles provided by the solution in Table 1 and Table 2 which are shown as a function of the number of modes taken into consideration. The grating bars are marked by the white dashed squares. When four or more modes are utilized, the boundary condition matching is almost perfect. The high reflectivity is clearly demonstrated by the standing wave profile created by the incident and reflected plane waves above the HCG. It will be seen in the figures that accuracy increases in response to increasing the number of modes taken into account from one in FIG. 7A to five in FIG. 7E. A single mode solution, as expected, is not enough to satisfy the boundary conditions at the HCG output planes ($z=t_g$ and $z=0$), while a two mode solution is already comes close to the final result. However, while a two mode solution is sufficient in terms of reflectivity, as shown in FIG. 6, it is still lacks precision in regards to its boundary condition matching, as seen in FIG. 7A through FIG. 7E, which requires four modes.

FIG. 8A through FIG. 8D depict separate contour plots for each mode inside the HCG, whose grating bars are marked by white dashed squares. The first mode is shown to exist principally in the air-gaps, while the second mode has a comparable intensity and is shown mainly within the area of the grating bars. The third mode is a surface wave, evanescently decaying into the grating with an intensity approximately fifty (50) times smaller than the first two modes.

1.1 Two-Port Circuit Analogy.

The immediate benefit of the transmission line formulation described in Table 1 and Table 2 is that the reflectivity phenomena discussed above can be approached in terms of widely used transmission-line impedance terminology, with the significant difference that the impedance according to the present invention is a matrix. In microwave theory, circuits described by matrix impedances are called multi-port circuits. The present invention extends an analogy between the multiple modes excited by the incident plane wave to a multiple-port circuit, characterized by an impedance matrix $Z_{in}$, given in Eq. 14, such that each mode corresponds to a circuit port. The prevalence of the first two modes, demonstrated in FIG. 6, makes it reasonable to limit the discussion to a two-port circuit and analyze its 100% reflectivity condition.

Figure 9:
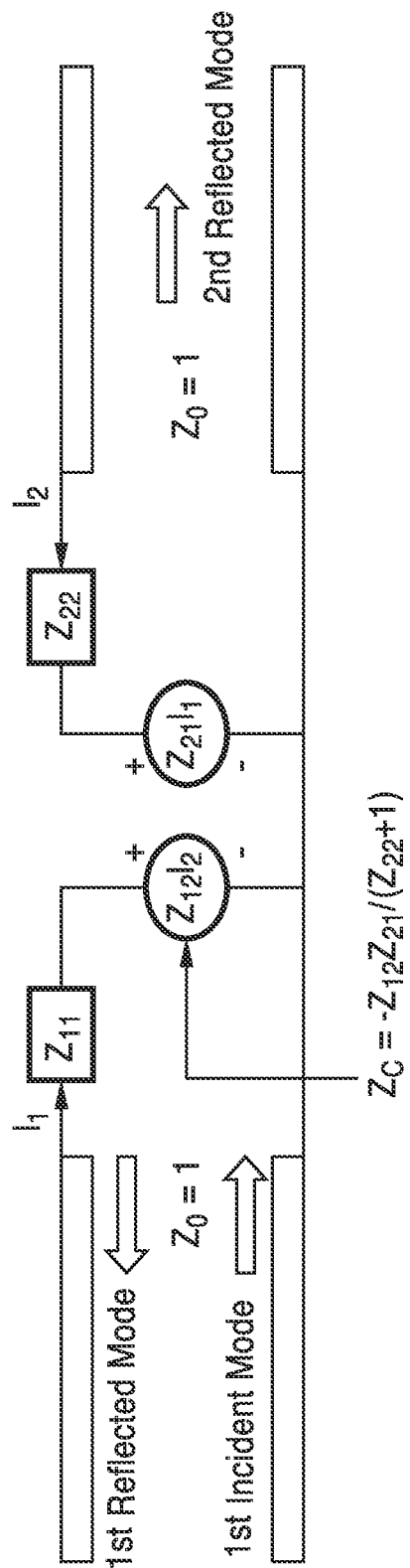
FIG. 9 is a schematic of a two-port circuit analogy which can be applied to reflectivity phenomena according to the invention.

FIG. 9 illustrates a two port circuit analogy for the HCG which is represented by perhaps the best known model for a two-port circuit. When the real part of $Z_C$ cancels-out the real part of $Z_{11}$, then 100% reflection is obtained as per Eq. 16.

The incident and reflected modes occurring at the left side transmission line shown in the figure, are an analogy to the plane wave, being incident and reflected from the HCG. The transmission line shown on the right side is an analogy to the second mode reflected from the HCG, which is a surface bound mode. In this analogy, the portion of the plane wave transmitted through the HCG is considered lost, and this loss is represented by a voltage drop associated with the real part of the impedance $Z_{11}$, while $Z_{22}$ plays the same role with regards to the second reflected mode. The HCG itself in this analogy is regarded as a coupling device between the first mode (plane wave) and the second mode, and is therefore represented by the two conditional voltage sources: $Z_{12}I_2$ represents the coupling from the second mode to the first and $Z_{21}I_1$ represents the coupling from the first mode to the second. Impedance $Z_C$ represents the coupling impedance from the second port into the first. Accordingly, the condition for full reflectivity of a two-port circuit is given by:

$$\text{Re}(Z_{11}) = -\text{Re}(Z_C) = \text{Re}[Z_{12}Z_{21}/(Z_{22}+1)] \quad (16)$$

When Eq. 16 is satisfied, the voltage drop associated with the real part of $Z_{11}$ is cancelled out by a voltage gain from the conditional source $Z_{12}I_2$, representing the feedback from the second port. In impedance terms, this entails the real part of $Z_{11}$ being cancelled out by the real part of $Z_C$. This means that the wave entering the first port encounters a non-resistive (purely reactive) impedance and is thus fully reflected. In the equivalent case of the HCG, when Eq. 16 is satisfied, the power carried by the plane wave does not leak through the grating. Instead, this power is being stored in the excited surface waves, which cannot carry the power out of the HCG and thus act as equivalent reactive elements. These surface waves couple the power back into the reflected plane wave, causing full reflection. This of course can never happen in a case of a uniform dielectric layer (grating with DC=100%), since it does not support surface waves upon plane wave incidence, and therefore the power cannot be stored and coupled back.

Figure 10A:
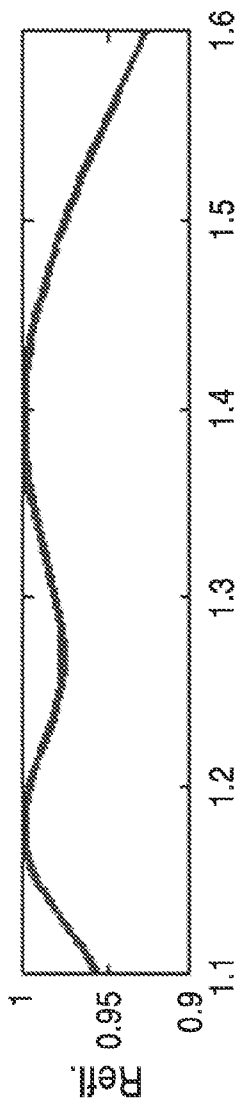
FIG. 10A through FIG. 10C are graphs of reflectivity spectrum and normalized impedance encountered by the incident plane wave.
Figure 10B:
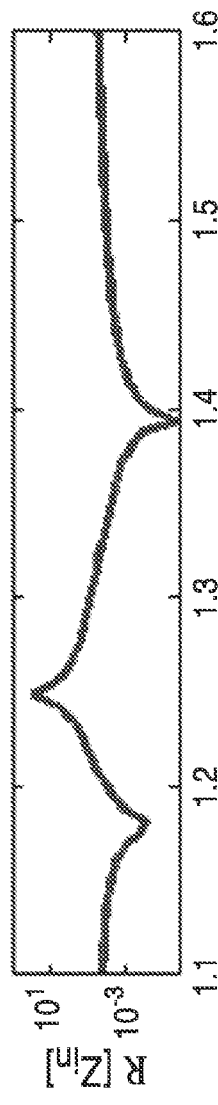
Figure 10C:
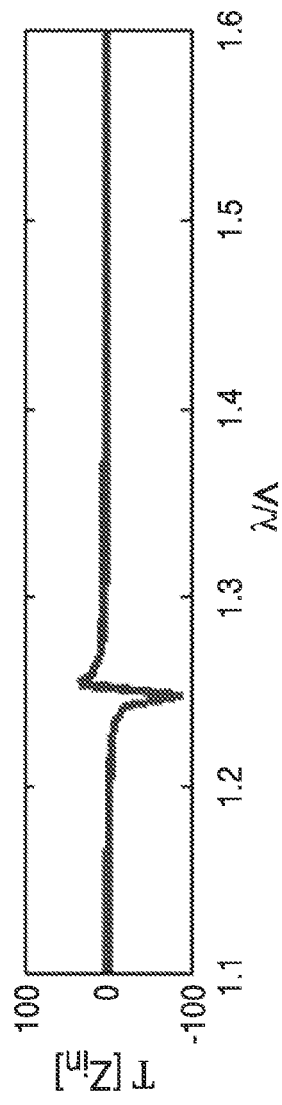

FIG. 10A through FIG. 10C depict reflectivity and impedance characteristics according to the inventive impedance analogy. In FIG. 10A a reflectivity spectrum is shown with the corresponding normalized input impedance, $Z_{in}=Z_{11}+Z_C$, encountered by the incident plane wave. The two high reflectivity peaks correspond to the two purely imaginary input impedances. The parameters are: TE polarization, $\eta_r=3.2$, DC=0.4, $t_g/\Lambda=0.222$.

The effective entrance impedance of the HCG, encountered by the incident plane wave is shown in the figure, along with the corresponding reflectivity spectrum. The set of figures illustrate that both reflectivity peaks correspond to entrance impedances which have no real part ($\text{Re}(Z_{in})=0$), which confirms that in the case of full reflection the HCG acts as an optical reactive element.

From the theory of Chebyshev filters it is known that when multiple spectral peaks are located in close vicinity of each other, a broadband spectrum is obtained. In addition, the spectral bandwidth of Chebyshev filters can be broadened at the expense of ripple. A similar phenomenon arises in the use of broadband HCGs, in which the number of proximal reflectivity peaks is typically two (or in rare configurations three). Designing a broadband HCG mirror relies on the fact that the HCG dimensions a, s, $\Lambda$, $t_g$, as seen in FIG. 1 and the wavelength $\lambda$ are all scalable, indicating that an HCG with dimensions (a, s, $\Lambda$, $t_g$) at wavelength $\lambda$ has the same reflectivity as an HCG with the dimensions (ca, cs, c$\Lambda$, c$t_g$) at wavelength c$\lambda$, with c being a positive constant. Using this filter analogy can greatly simplify HCG design, since the first steps can be performed in normalized units: $t_g/\Lambda$, $\lambda/\Lambda$ and DC=s/$\Lambda$, and then all the normalized dimensions can be scaled back according to the desired wavelength.

Figure 11A:
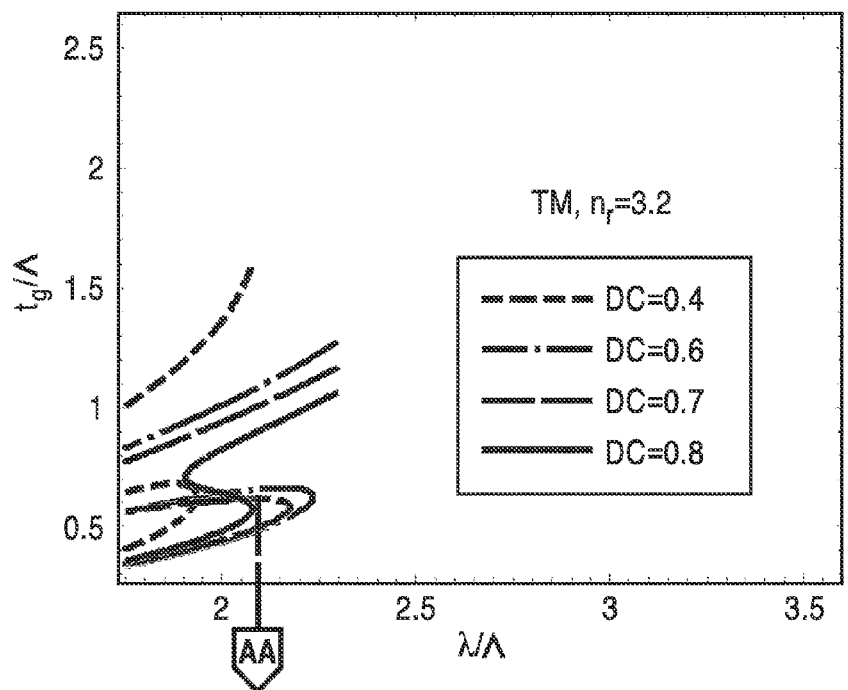
FIG. 11A through FIG. 11D are graphs of grating design parameters according to elements of the present invention.
Figure 11B:
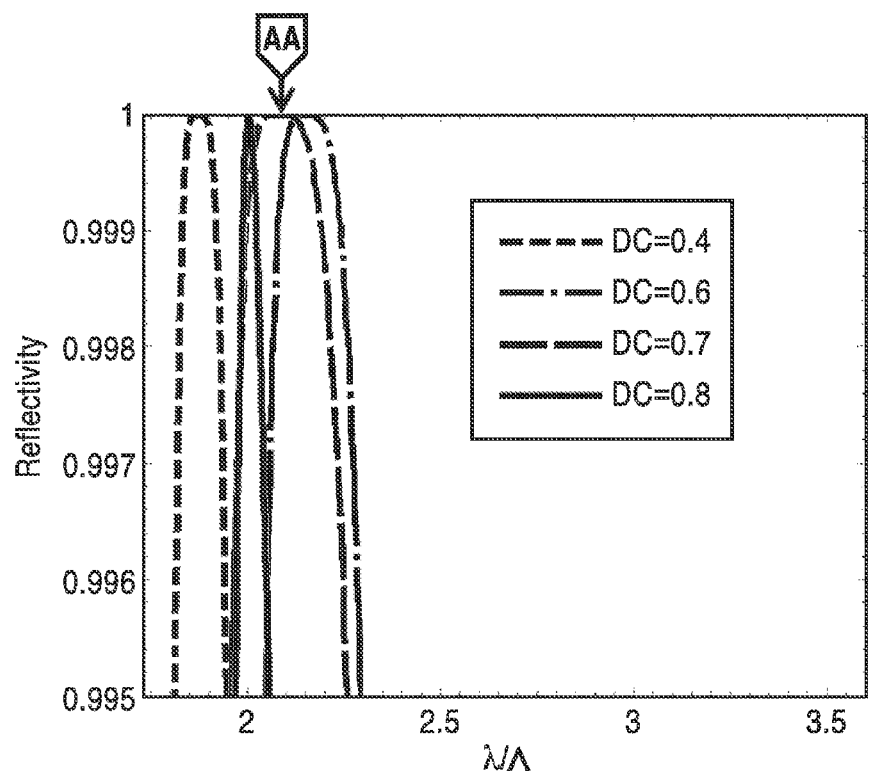
Figure 11C:
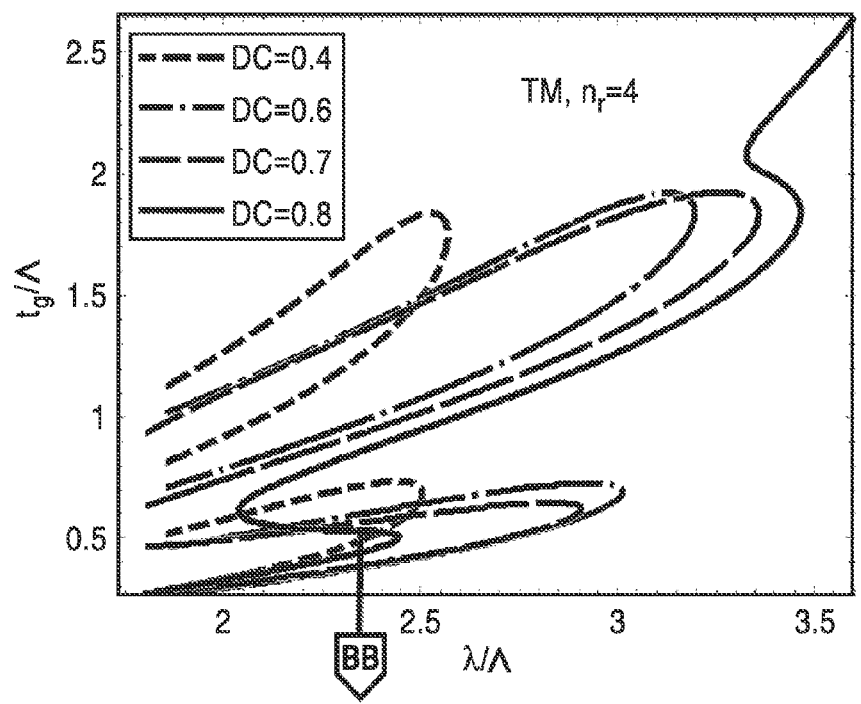
Figure 11D:
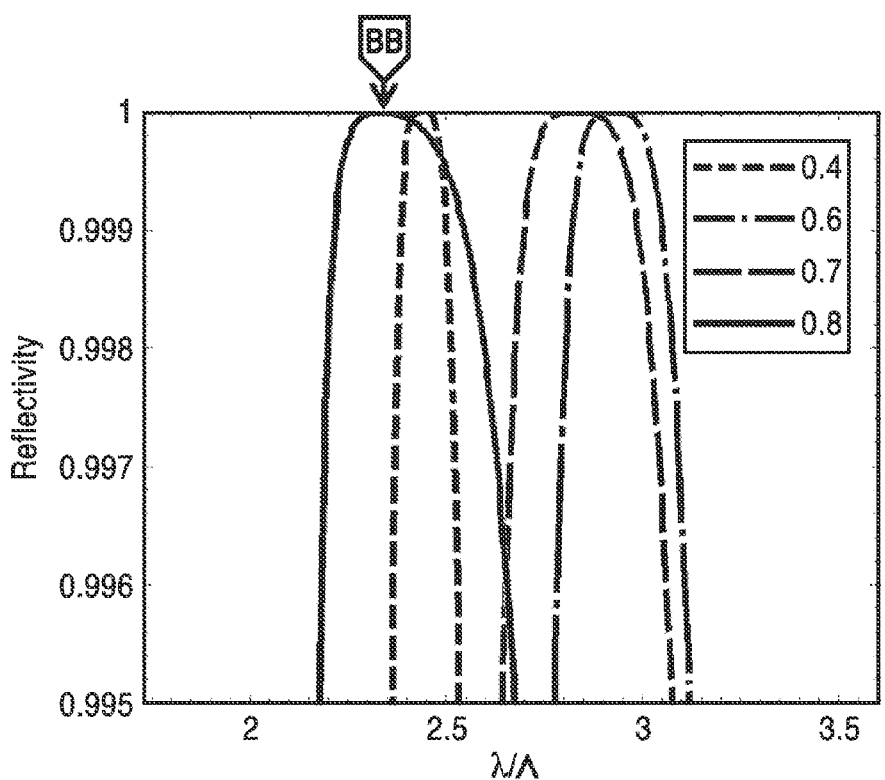

FIG. 11A and FIG. 11C illustrate plotting these optimal values of $t_g/\Lambda$ with respect to $\lambda/\Lambda$ for different duty cycles for two different refractive indices. The implementation of the filter analogy is as follows: (i) For each normalized wavelength $\lambda/\Lambda$, a discrete set of normalized thicknesses $t_g/\Lambda$ will generate 100% reflectivity by satisfying Eq. 16; (ii) Among all duty cycles in these curves the flattest region (broadest spectrum), corresponding to broad-band high reflectivity, is chosen as marked by the arrows shown from FIG. 11A and FIG. 11C, down to the reflectivity graphs of FIG. 11B and FIG. 11D. Higher refractive index contrast (right figures) leads to broader spectra. The middle of the flattest region corresponds to the optimal values of DC, $t_g/\Lambda$ and $\lambda/\Lambda$; (iii) Finally, according to the desired central wavelength $\lambda$, the normalized dimensions are rescaled.

Accordingly, FIG. 11A through FIG. 11D demonstrate implementation for two different refractive indices $\eta_r$=3.2 (FIG. 11A and FIG. 11B) and $\eta_r$=4 (FIG. 11C and FIG. 11D) and it reveals the intuitive conclusion, which is at the core of the motivation for using High Contrast Gratings, that when the refractive index contrast is higher ($\eta_r$=4), the achievable spectra are broader. In addition, when the refractive index contrast is higher, the range of grating geometries supporting high reflectivity becomes wider, as reflected in the differences seen between FIG. 11A compared with FIG. 11C. This is why high contrast gratings tend to provide large fabrication tolerances.

Figure 12:
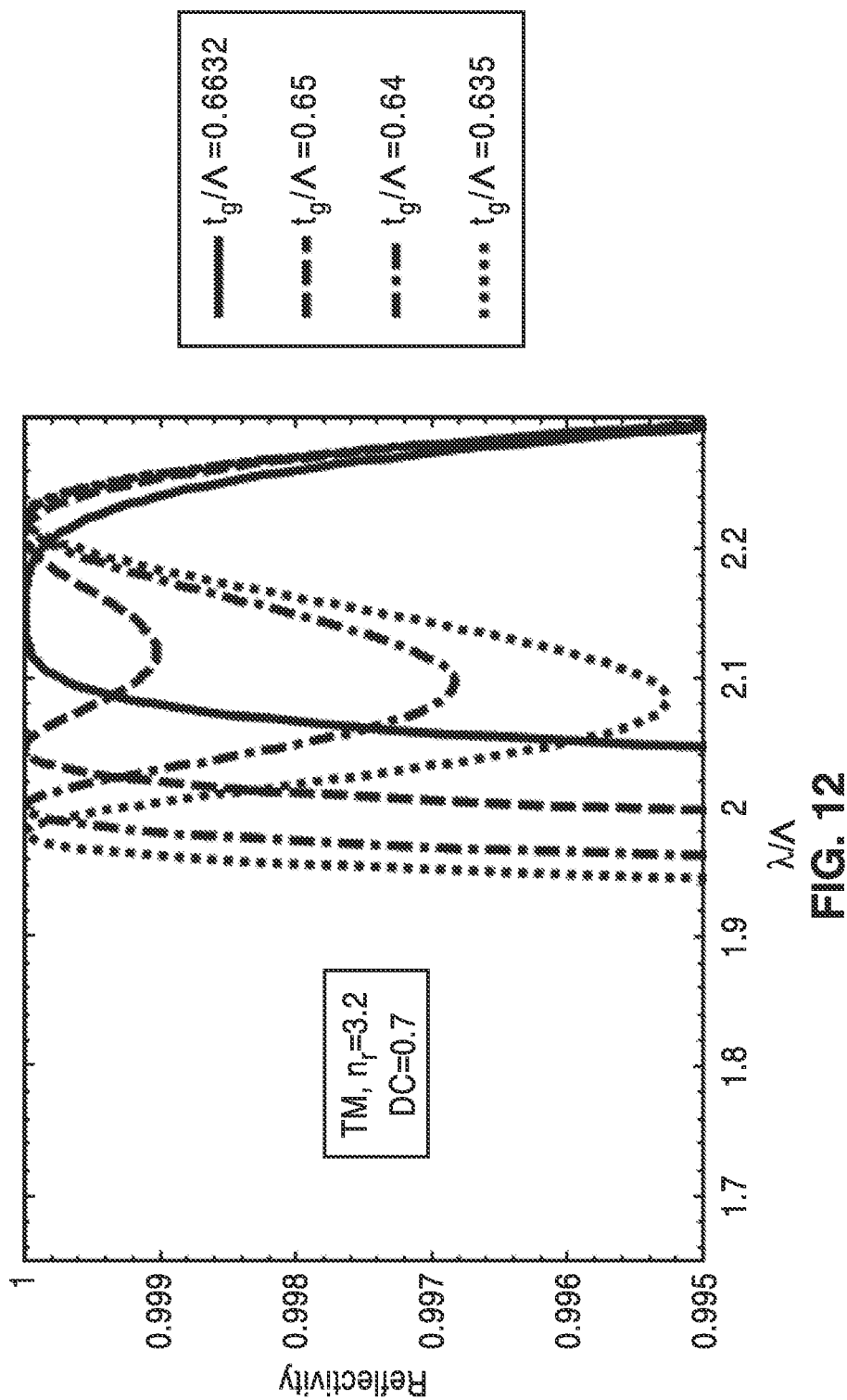
FIG. 12 is a graph of grating line width with respect to ripple found in the similar Chebyshev filter according to elements of the present invention.

FIG. 12 depicts tradeoffs of line width and ripple in a similar manner as used with Chebyshev filters; that is, once the broadband configuration is found, the reflectivity spectrum can be broadened even further by decreasing the grating thickness. In demonstrating the similarity to Chebyshev filters, It will be noted that a decrease in grating thickness will push the two overlapping peaks apart, further increasing the bandwidth at the expense of rippling the spectrum.

1.2 Destructive Interference at the Output Plane.

In addition to the transmission line formulation described above, the following offers an intuitive description for the phenomenon of 100% reflectivity in terms of wave interference.

First consider a reflection from a uniform dielectric layer. In order for the reflection to reach 100%, the transmission must be fully cancelled. In the case of surface normal incidence, zero transmission can only be obtained if the lateral (x,y) electric and magnetic field components inside the layer are zero at the back output plane (z=0). In the case of uniform dielectric layers, however, it is obvious that the electric and the magnetic fields cannot both have minima at the same z, since minima of one is always accompanied by maxima of the other. However, if it were possible to excite more than one mode within the uniform layer, the additional degree of freedom would have made it possible to design a geometry in which the multiple modes interfere with their reflected counterparts in a way that the overall E and H field components are both zero at z=0.

Unfortunately, in simple uniform dielectric layers multimode excitation does not occur under the condition of plane wave incidence. The alternative is to break the uniformity by introducing a grating. When a plane wave is incident upon a grating, multiple modes are excited within it, which introduces the necessary degree of freedom to achieve destructive interference at the back output plane. Since the grating modes are not laterally constant, instead of the overall field being zero, their average (with respect to x axis) is required to be zero, since it is the lateral average that determines whether or not there is a field overlap with the transmitted wave, and thus whether or not the transmitted wave can be excited.

Figure 13:
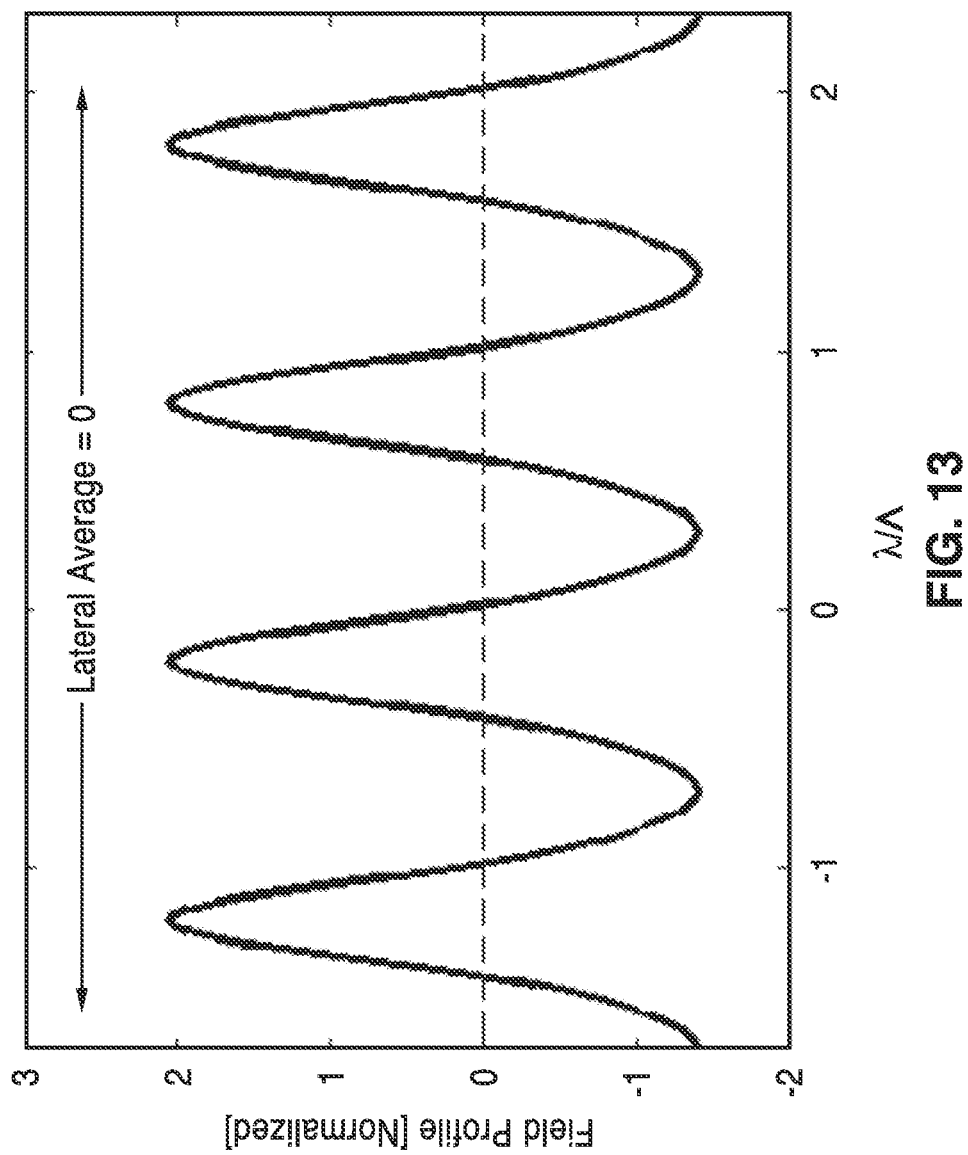
FIG. 13 is a graph of grating field profile with respect to period ($\lambda/\Lambda$).

FIG. 13 depicts a field profile at the bottom grating output plane (back output plane) of the HCG (z=0). The zero lateral average is an indicator for the perfect destructive interference, whereby the overall field profile, which combines all modes and their reflections, is zero on average.

2. High Contrast Grating (HCG) Based Saturable Absorber.

Figure 14:
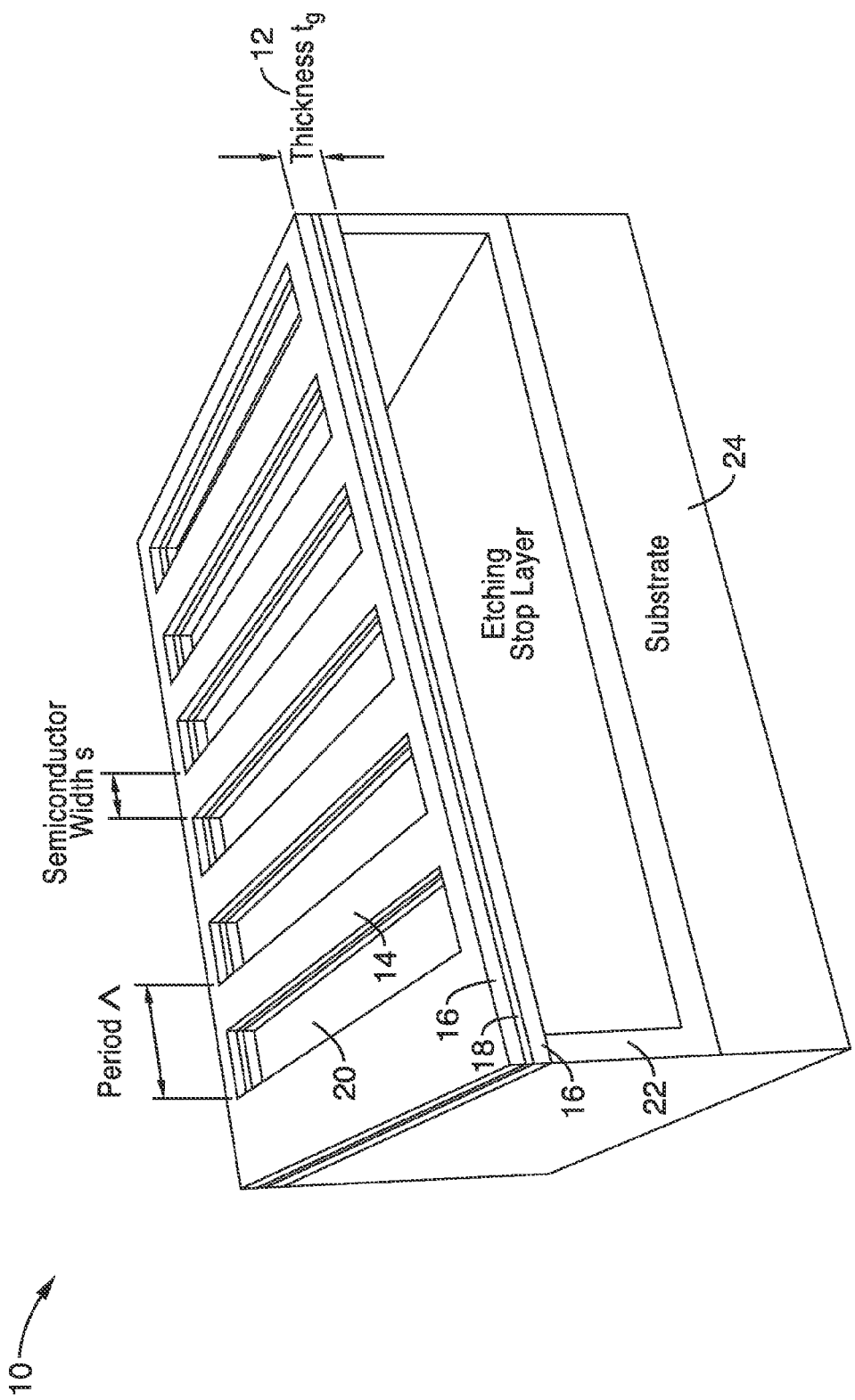
FIG. 14 is a schematic of an HCG-based saturable absorber according to an embodiment of the present invention.

FIG. 14 illustrates an example embodiment 10 of a High Contrast Grating (HCG) based Saturable Absorber (SA) having a grating layer 12 having a thickness $t_g$ with semiconductor bars 14 of width s spaced at a period $\Lambda$. Grating layer 12 comprises cladding 16 and at least one layer of optically absorbing structures 18 (e.g., quantum structure layers comprising quantum wires, wells and/or dots). High index grating bars 14 are surrounded by low index material 20, such as air. An etch stop layer 22 is shown by way of example beneath the grating over a substrate layer 24. The gratings have a high refractive index (i.e., in excess of 2, preferably above 2.5, and more preferably greater than 3), which preferably comprise a semiconductor material. Three physical parameters control the reflectivity of the grating, including: period ($\Lambda$), thickness ($t_g$), and duty cycle ($\eta$). The thickness and period are sub-wavelength, and the duty cycle is defined as the ratio of the width of the high index material (s) to $\Lambda$. In response to proper design parameters, the HCG can provide a reflection band that has a broad bandwidth (broadband) and has a high reflectivity.

In the embodiment described above, the absorbing material comprises the quantum structures buried within the grating bar whose positioning within the grating bars is configured so that the absorption is nearly uniform for a wide range of frequencies. The heterostructure can be grown by standard processing techniques, including but not limited to epitaxy (e.g., Molecular Beam Epitaxy (MBE) and/or Metal-Organic Chemical Vapor Deposition (MOCVD)), and fabricated using steps similar to those of an HCG-VCSEL or HCG-resonators.

It should be appreciated that although the grating is represented in the example embodiments as a plurality of parallel rectangular bars, it can be alternatively implemented comprising bars in curved sections or nested rings without departing from the teachings of the invention. The material surrounding the grating bars, such as above, below and in-between, may comprise a material, or combination of materials without departing from the inventive teachings.

By way of example and not limitation, a Ytterbium (Yb) or Neodymium (Nd) mode-locked laser centered at 1060 nm can be configured according to the present invention. The HCG, for example, is made of Aluminum Gallium Arsenide (AlGaAs) while the sandwiched absorption layer is fabricated from Indium Gallium Arsenide (InGaAs). The example grating period $\Lambda$ is 880 nm, with a semiconductor bar width (s) of 387 nm, and a grating thickness ($t_g$) of 210 nm. The etch stop layer can also be of AlGaAs, with the substrate in this example comprising GaAs. In this example, the air gap between the grating and the etching stop layer was set to be 1440 nm. The design example is configured for TE polarization, in which the electrical field of the incident light is parallel to the grating bars; although the polarization grating can be configured using different grating dimensions to operate with TM polarization grating.

Figure 15:
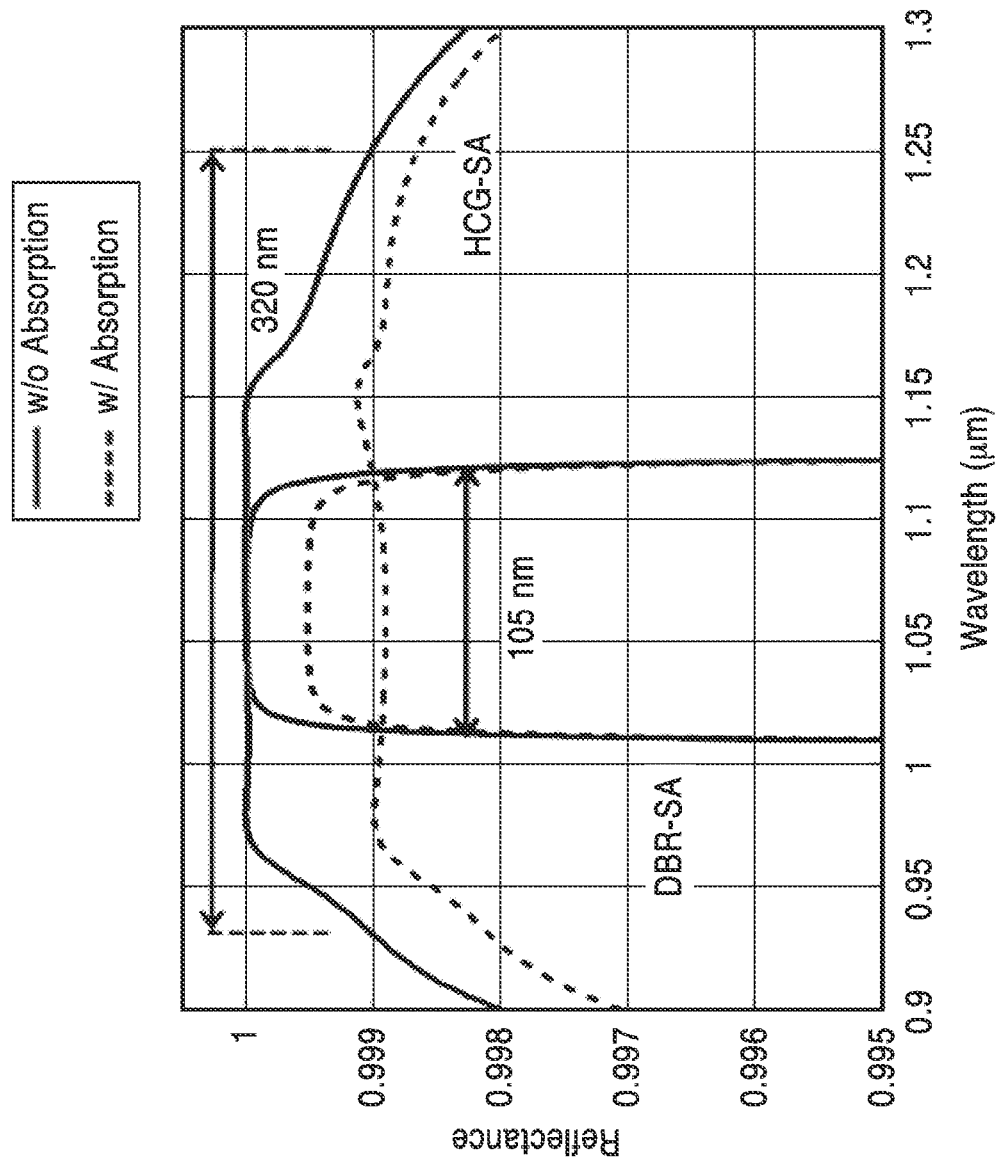
FIG. 15 is a plot of reflectance for an HCG-based saturable absorber (HCG-SA) for cases with and without absorption.

FIG. 15 depicts the calculated HCG reflection spectrum using rigorous coupled wave analysis (RCWA), showing that a very wide high-reflectivity (R>99%) band of 320 nm was achieved. This reflection bandwidth is three times larger than that of a 30-pair GaAs/AlAs DBR. With a constant absorption coefficient of $0.4 \times 10^4$/cm, 1% absorption is achieved nearly uniformly in the band from 970 nm to 1150 nm. For the classical DBR-based SESAM (DBR-SA), with the same thickness of absorption material, the absorption is only half of that of HCG-based saturable absorber (HCG-SA). Strong QW absorption can be achieved in HCG because the configuration also facilitates a large field enhancement and spatial overlap with the QW.

Figure 16A:
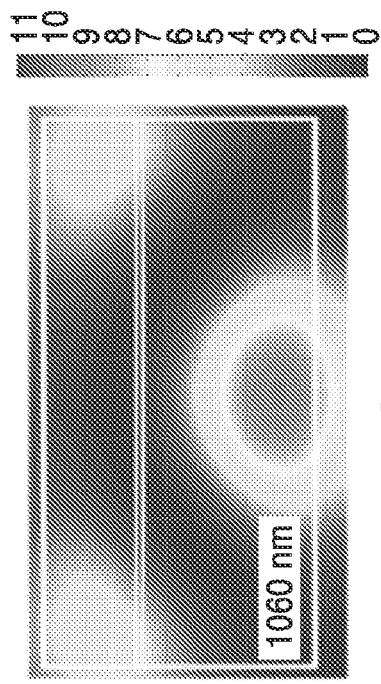
FIG. 16A through FIG. 16D are contour plots of field intensity profile of an HCG bar, according to an element of the present invention, shown at four different wavelengths.
Figure 16B:
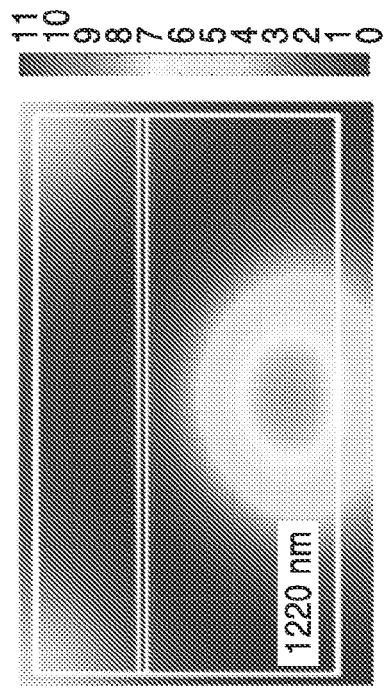
Figure 16C:
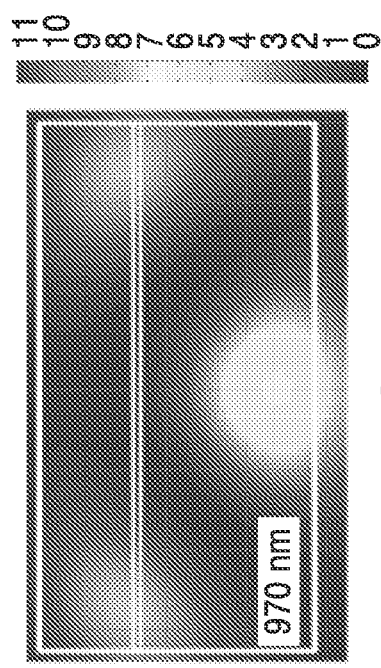
Figure 16D:
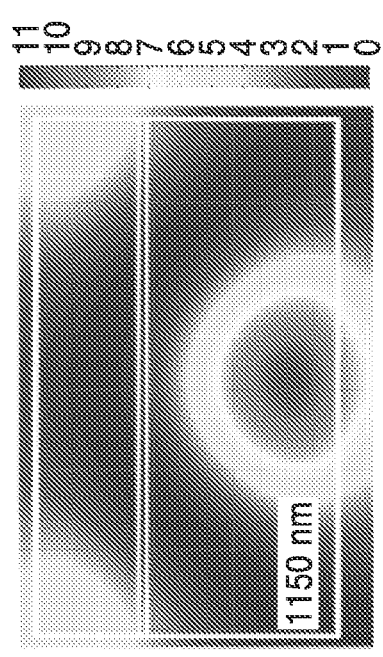

FIG. 16A through FIG. 16D depict a field intensity profile of the HCG bar (inside the white box) at four different wavelengths, FIG. 16A at 970 nm, FIG. 16B at 1060 nm, FIG. 16C at 1150 nm, and FIG. 16D at 1220 nm, with the white bar indicating the position of the quantum well. A finite-difference time-domain method was used to simulate the electrical field profile inside the grating bar shown in the figure. The field enhancement inside the HCG grating can be as large as 11, whereas this number is approximately 0.34 in a classical DBR-SA. Thus, the field enhancement provided by the HCG of the current invention exceeds that of a DBR-SA by over an order of magnitude. The large field enhancement is necessary for bringing down the saturation fluence for the high repetition frequency mode-locked lasers. Although the field enhancement does vary with different frequencies, the position of the quantum well can be designed to achieve relatively uniform frequency response (also shown in FIG. 15), while still maintaining a relatively high field enhancement, compared with that of the classical DBR-SA. The present invention provides significant design flexibility to satisfy different requirements in mode-locked lasers, such as bandwidth, modulation depth, and so forth.

Figure 17:
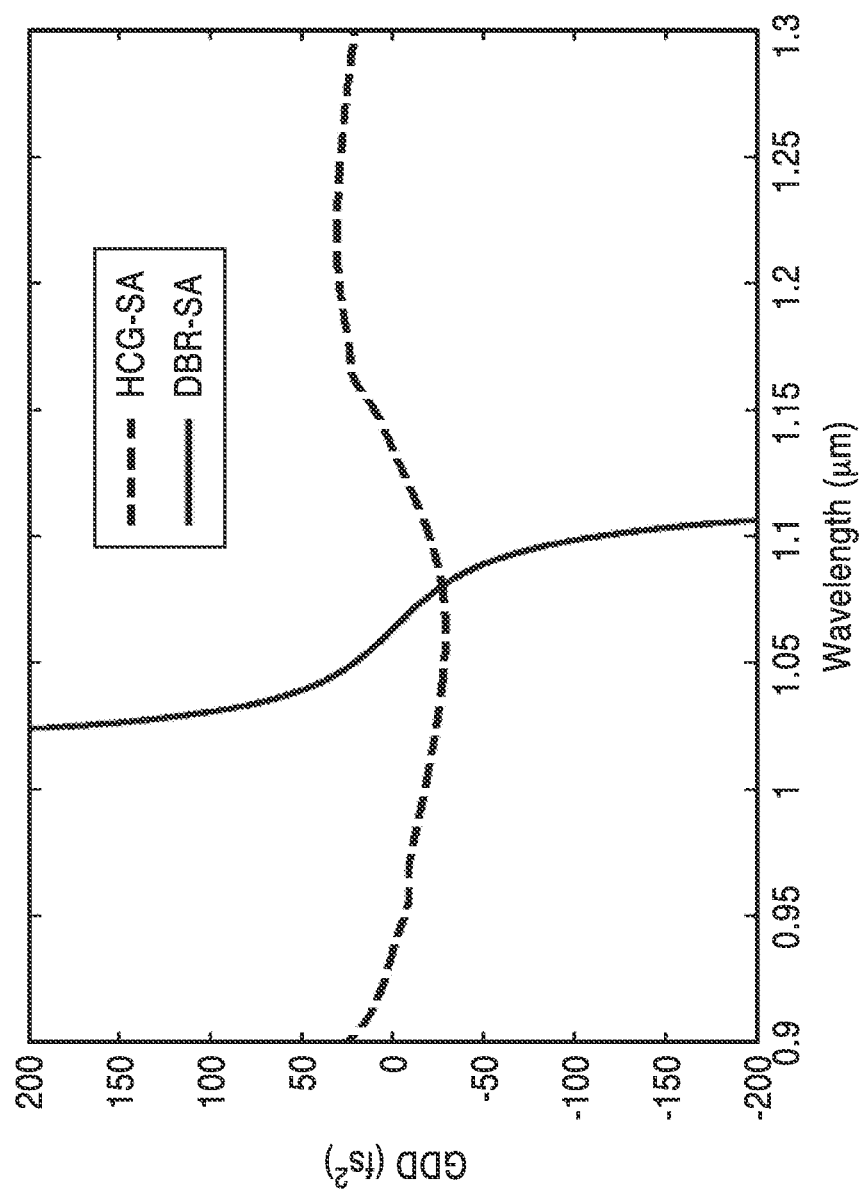
FIG. 17 is a plot of Group Delay Dispersion (GDD) for an HCG-SA according to an element of the present invention, compared with a DBR-based SESAM.

FIG. 17 depicts group delay dispersion (GDD) of an HCG-based saturable absorber (HCG-SA) in comparison with a DBR-based SESAM (DBR-SA). It should be noted that for a DBR-SA, only the GDD within the reflection band is shown. It is seen for the HCG-SA that GDD is relatively flat along the whole reflection band, which represents a significant improvement over the DBR structure.

Figure 18:
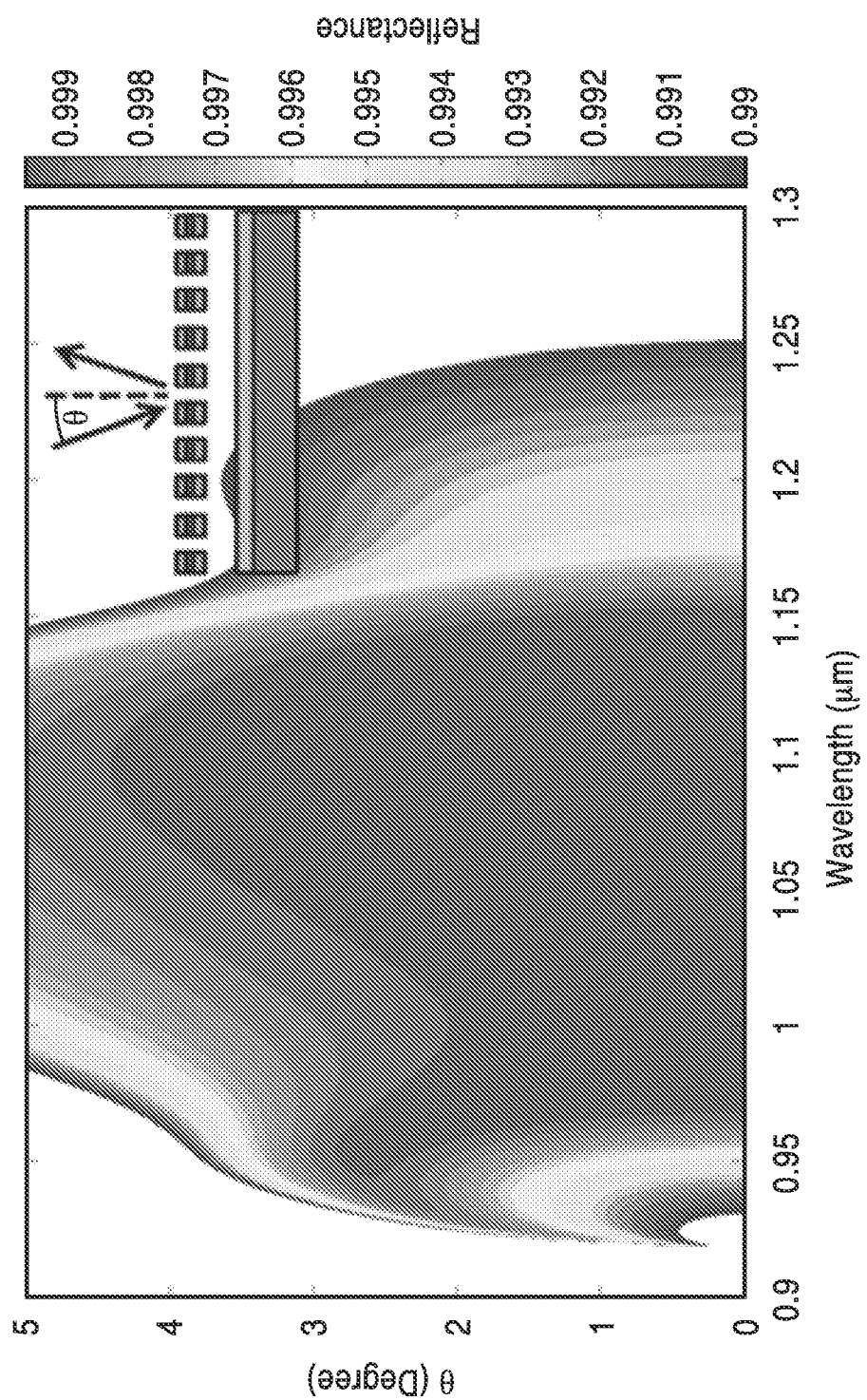
FIG. 18 is a contour plot of reflectance for an HCG-SA according to an embodiment of the present invention, showing different incident angles.

FIG. 18 depicts reflectance of an HCG-based saturable absorber in response to different angles of incidence. The HCG maintains a large high reflection band within 3° (3 degrees) of incident angle, making it suitable for positioning after a typical focal lens in the cavity of a monolithic laser.

From the above discussions, it will be appreciated that the high contrast grating based saturable absorber according to the present invention is particularly well-suited for use in external-cavity mode-locked vertical-cavity surface-emitting lasers.

The HCG-based saturable absorber integrated with lensing effect can replace two separate components (lens and SESAM) in the traditional external-cavity mode-locked VCSELs, and thus results in a more compact external cavity. Different HCG designs (period, duty cycle, and thickness) generate different phase changes for reflection light. By chirping the period and duty cycle of each grating bar in HCG (continuously varying grating period along the direction of grating bar distribution), the reflection light at different positions in the HCG is subject to different phase changes. The reflection can be configured so that the reflection phase distribution on the HCG surface is the same as that of a reflection lens. Meanwhile, the HCG can still maintain a very high reflectance, which is essential for an external cavity mirror. Thus, by chirping the period and duty cycle of the grating bars in the above HCG-based saturable absorber (FIG. 14), it can serve as a reflective lens mirror for the external-cavity mode-locked VCSEL.

Figure 19:
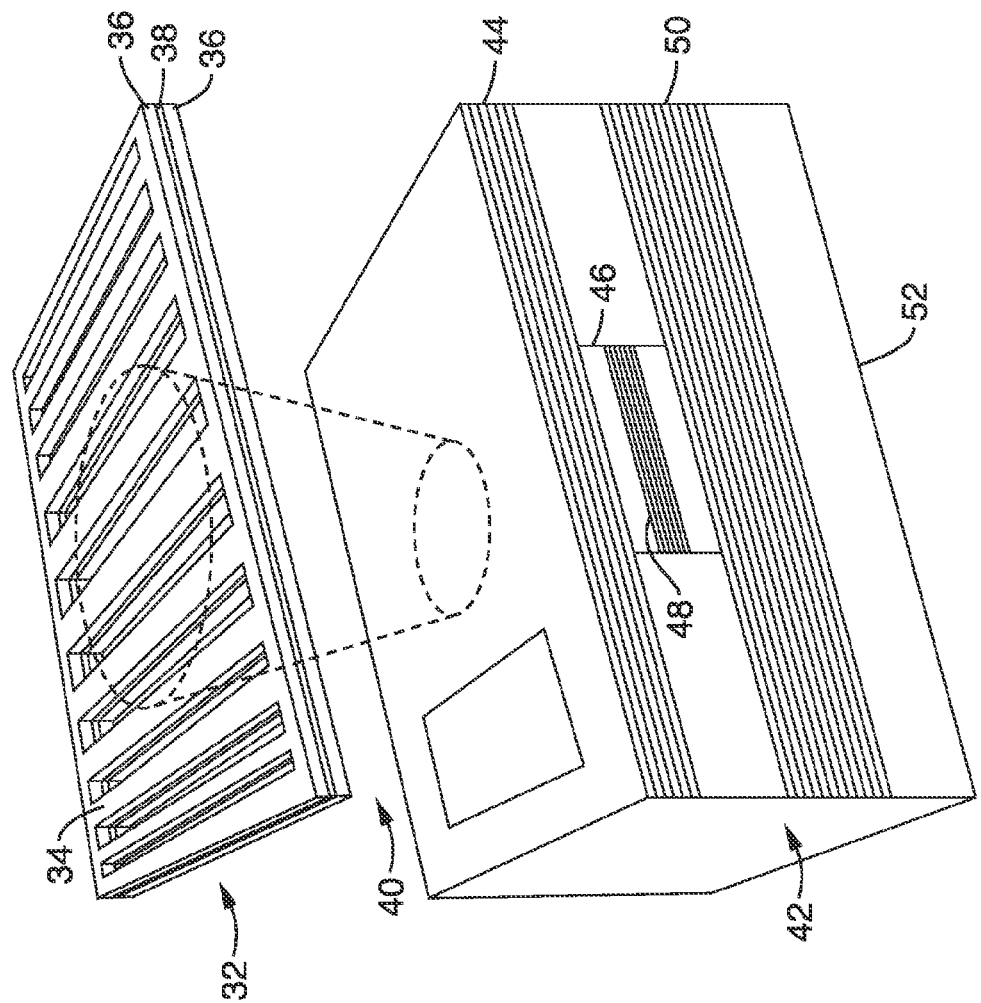
FIG. 19 is a schematic of an external-cavity mode-locked VCSEL incorporating an HCG-based saturable absorber according to an embodiment of the present invention.

FIG. 19 illustrates an example embodiment 30 of an external-cavity mode-locked VCSEL with the HCG based saturable absorber as the external reflective lens mirror. A grating 32 is shown with grating bars 34, which are preferably spaced with varying period ($\Lambda$) and duty cycle ($\eta$) (i.e., chirped), and having cladding layers 36 within which is disposed at least one layer of quantum structures 38, such as quantum wells or quantum dots. The periodically spaced grating elements also provide a lensing effect in response to being configured with varying bar width along their length and/or distribution direction.

A gap 40 is shown in this embodiment separating the HCG-SA in FIG. 18 from the monolithic portion 42 of the VCSEL structure and forms a significant lengthwise portion of the laser cavity. The VCSEL is configured with a DBR structure 44 over a well 46 containing an active region 48, and beneath which is seen bottom mirror 50, depicted as another DBR structure, over a substrate 52.

It should be noted that for the sake of simplicity, the HCG-SA is drawn to depict 1D lensing effect in this figure by varying the bar width along the bar direction. It should be appreciated, however, that the HCG-SA can be configured to provide a 2D lensing effect by changing bar width along the length of each bar. It will be appreciated that 2D lensing should be more effective in an actual laser system application.

The focal length of the HCG based saturable absorber can be designed so that the external cavity length is flexible for supporting different repetition rate frequencies of the mode-locked VCSELs. Meanwhile, the field enhancement inside the HCG can be maintained, so that the saturable absorber can have low saturation fluence, making it suitable for generating high repetition rate pulses.

To further reduce the saturation fluence, quantum dots instead of a quantum well can be utilized within an absorption layer. Due to the quantum confinement, quantum dots have a lower density of states compared with a quantum well, which would make it easier to saturate the absorption layer and thus reduce saturation fluence.

The HCG-SA according to the invention can be applied to additional applications, such as within monolithic electrical-pumped passively mode-locked VCSELs. Prior to the application of the present invention, passively mode-locked VCSELs required an external cavity. This was necessary because the cavity length of the VCSEL was so short that it could only support one longitudinal mode, while mode-locking requires the lasing of multiple longitudinal modes. Accordingly, an external cavity was needed to increase the cavity length, and an optical pump was necessary for such an external-cavity VCSEL system.

The present invention can be utilized to further simplify the VCSEL system within a monolithic electrically-pumped passively mode-locked VCSEL, which requires a long intra cavity length. One of the difficulties of making a monolithic long cavity VCSEL is optical confinement. Gain guided effect is very weak in a long cavity, and lasing is difficult to achieve as the light is subject to rapid dispersion inside the cavity. Utilization of an HCG in this situation can solve this problem in response to utilizing its lensing effect. When properly configured, a HCG can be utilized for replacing both the top and bottom DBR mirrors of the VCSEL cavity. It will be appreciated, that to provide mode-locking, the bottom HCG must be properly integrated with the saturable absorption layer, and also provide the proper lensing effect for light confinement within the cavity. It will be noted that without an external cavity, the VCSEL can be electrically pumped.

As an example, if the repetition frequency is designed to be 100 GHz, the cavity length would be around 500 μm (refractive index of semiconductor is around 3). For such a high repetition frequency rate, a very low saturation fluence is needed for mode-locking. Field enhancement inside the HCG, as well as the low density of state of the quantum dots in the absorption layer are thus desirable to bring down the saturation fluence. The lateral confinement in such a long cavity would also be provided by the lensing effect of the HCG.

FIG. 20 illustrates an example embodiment 70 of a monolithic long cavity passively mode-locked VCSEL using the HCG-SA previously described. An output mirror is shown comprising an HCG 72 with bars 74 over a small gap 76 within the monolithic structure over a low index material 78 and well 80 having an active region 82. The periodically spaced grating elements 74 in grating 72 can be configured with specific varying width along their length and/or distribution direction to provide a lensing effect. Additional low index material 84 is disposed beneath active region 82, followed by another small monolithically integrated gap 86 and a grating 88 having cladding 90 and at least one quantum structure layer 92, serving as the saturable absorption layer. It should be appreciated that descriptions of top and bottom in relation to the elements of the structures are provided for the sake of illustration, whereas these structures can be inverted (reversed) or fabricated at any desired intermediate angles without departing from the inventive teachings herein.

The HCG-based saturable absorber provides a significantly broader high reflection band compared with the traditional DBR based SESAM. Strong absorption can be achieved in HCG because the structure facilitates a large field enhancement and spatial overlap with the absorption layer which reduces saturation fluence, which is important in high repetition rate mode-locked lasers. To provide even lower saturation fluence, quantum dots may be utilized to replace the quantum wells previously described. The group delay dispersion of the HCG based saturable absorber is relatively flat along the whole reflection band, which is a significant improvement over that in the DBR structure.

Consequently, it has been seen that by integrating an HCG-based saturable absorber (SA) with its lensing effect, the compactness and ease of fabrication of external-cavity mode-locked VCSELs is enhanced. In addition, by replacing the bottom DBR of the VCSEL with this HCG-based saturable absorber, a monolithic electrical-pumped passively mode-locked VCSEL can be fabricated.

The teachings of the present invention can be applied to a wide range of application areas, the following list being provided by way of example and not limitation:

(1) mode-locked solid state lasers;
(2) femtosecond fiber lasers;
(3) external-cavity mode-locked VCSELs;
(4) monolithic electrical-pumped passively mode-locked VCSELs; and
(5) pulse shaping devices.

From the description herein, it will be further appreciated that the invention can be embodied in various ways, which include but are not limited to the following.

The present invention provides methods and apparatus for saturable absorption within a high-contrast grating structure. Inventive teachings can be applied in a variety of apparatus and applications, including vertical cavity surface emitting lasers (VCSEL), and so forth.

As can be seen, therefore, the present invention includes the following inventive embodiments among others:

1. A semiconductor saturable absorber mirror apparatus, comprising: a high-contrast grating (HCG) having grating elements with an index of refraction at or exceeding approximately 2; said high-contrast grating elements having sub-wavelength dimensions, in grating element width and spacing; a low index of refraction material, or materials, surrounding said grating elements; and at least one layer of optically absorbing structures buried within each of said grating elements within said high-contrast grating.

2. The apparatus of embodiment 1, wherein said optically absorbing structures comprise any combination of quantum wells, wires and/or dots.

3. The apparatus of embodiment 1, wherein said optically absorbing structures have a reduced absorption of light with increasing incident light intensity.

4. The apparatus of embodiment 1, wherein said at least one layer of optically absorbing structures are incorporated between high index of refraction cladding layers within each of said grating elements.

5. The apparatus of embodiment 1, wherein said at least one layer of optically absorbing structures are incorporated on the surface of said grating elements.

6. The apparatus of embodiment 1, wherein said grating elements are periodically spaced.

7. The apparatus of embodiment 1, wherein said grating elements are configured of varying grating element width and/or spacing along their length and/or distribution direction to provide a lensing effect.

8. The apparatus of embodiment 1, wherein said high-contrast grating elements are chirped by varying grating element width and/or spacing along a distribution direction of said high-contrast grating elements to provide varying phase changes along a length of said high-contrast grating.

9. The apparatus of embodiment 1, wherein said optically absorbing layer inside said high-contrast grating of said apparatus is configured for overlapping areas having an electrical field yielding a desired saturation fluence, at which pulse energy the absorption saturates.

10. The apparatus of embodiment 9, wherein said optically absorbing layer inside said high-contrast grating of said apparatus is configured to overlap with areas having the highest electrical field and associated saturation fluence, to reduce the pulse energy at a pulse energy that the absorption saturates.

11. The apparatus of embodiment 1, wherein three physical parameters control reflectivity of the grating, including period ($\Lambda$), thickness ($t_g$), and duty cycle ($\eta$); and wherein the duty cycle is defined as a ratio between width of the high index material (s) to its period ($\Lambda$).

12. The apparatus of embodiment 1, wherein said apparatus is configured as a mirror within a laser.

13. The apparatus of embodiment 12, wherein said apparatus is configured as a mirror within a laser configured for generating short optical pulses.

14. The apparatus of embodiment 1, wherein said apparatus is configured as a transmissive component within a laser.

15. The apparatus of embodiment 14, wherein said apparatus is configured as a transmissive component within a laser configured for generating short optical pulses.

16. The apparatus of embodiment 1, wherein said apparatus is configured as a reflection mirror within a vertical cavity surface emitting laser (VCSEL).

17. The apparatus of embodiment 16, wherein said apparatus is configured as an external reflection mirror.

18. The apparatus of embodiment 1, wherein said apparatus is configured as an integrated mirror within a passively mode-locked vertical cavity surface emitting laser (VCSEL).

19. The apparatus of embodiment 18, wherein said VCSEL is electrically-pumped.

20. An external cavity mode-locked vertical-cavity surface-emitting laser apparatus, comprising a high-contrast grating saturable absorber (HCG-SA) having grating elements, with subwavelength dimensions of grating element width and spacing, of a material having an index of refraction at or exceeding approximately 2; a low index of refraction material, or materials, surrounding said grating elements; and said HCG-SA having high index of refraction cladding surrounding at least one optically absorbing layer; a semiconductor active structure disposed in separation from said high-contrast grating saturable absorber, wherein said separation forms part of a vertical cavity; an active region within said vertical cavity surface emitting laser upon which a lens effect of said HCG-SA is focused; and a bottom mirror positioned beneath said active region.

21. The apparatus of embodiment 20, wherein said grating elements are configured of varying width and/or spacing along their length and/or distribution direction to provide a lensing effect.

22. The apparatus of embodiment 20, wherein said optically absorbing layer within the HCG-SA absorbs light from the active region of said vertical cavity surface emitting laser (VCSEL).

23. The apparatus of embodiment 20, wherein said bottom mirror comprises a multiple layer distributed Bragg reflector (n-DBR).

24. The apparatus of embodiment 20, wherein said bottom mirror comprises another high-contrast grating (HCG).

25. The apparatus of embodiment 20, wherein external cavity length changes in response to changing distance of said separation to support different repetition rates of the mode-locked vertical cavity surface emitting laser (VCSEL).

26. The apparatus of embodiment 20, wherein said optically absorbing layers comprise any combination of quantum well and/or quantum dots.

27. The apparatus of embodiment 20, wherein said at least one layer of optically absorbing layers are incorporated between high index of refraction cladding layers within each of said grating elements.

28. The apparatus of embodiment 20, wherein said at least one optically absorbing layer is incorporated on the surface of said grating elements.

29. The apparatus of embodiment 20, wherein said high-contrast grating elements are chirped by varying grating element width and/or spacing along a length and/or distribution direction of said high-contrast grating elements to provide varying phase changes along a length of said high-contrast grating.

30. The apparatus of embodiment 20, wherein said optically absorbing layer inside said high-contrast grating of said apparatus is configured to overlap areas which have an electrical field yielding a desired saturation fluence, at which pulse energy absorption is saturated.

31. The apparatus of embodiment 20, wherein said optically absorbing layer inside said high-contrast grating of said apparatus is configured to overlap areas of highest electrical field to reduce associated saturation fluence, at which pulse energy absorption is saturated.

32. A monolithic passively mode-locked vertical cavity surface emitting laser (VCSEL) apparatus, comprising: a top output mirror; an active region of a vertical cavity surface emitting laser disposed in separation below a low refractive index material, or materials, which are proximal said top output mirror; a bottom mirror positioned beneath said active region and comprising a high-contrast grating saturable absorber (HCG-SA) having grating elements with subwavelength dimensions in width and/or spacing, of a material with an index of refraction at or exceeding approximately 2; and at least one optically absorbing structure layer within said HCG-SA surrounded by high index of refraction cladding; wherein said top mirror, bottom mirror, active layer, and low index of refraction material or materials, are fabricated into a monolithic VCSEL structure having an internal cavity.

33. The apparatus of embodiment 32, wherein said top output mirror comprises a high-contrast grating (HCG) with grating elements, of subwavelength dimensions in width and/or spacing, from a material having an index of refraction at or exceeding approximately 2; and a low index of refraction material or materials surrounding said grating elements of said top output mirror.

34. The apparatus of embodiment 32, wherein said grating elements are configured of varying width along their length and/or distribution direction to provide a lensing effect.

35. The apparatus of embodiment 32, wherein said VCSEL is electrically-pumped.

36. The apparatus of embodiment 32, wherein said optically absorbing structure layer within the HCG-SA absorbs light from the active region of said vertical cavity surface emitting laser (VCSEL).

37. The apparatus of embodiment 32, wherein said top mirror comprises a distributed Bragg grating (DBR).

38. The apparatus of embodiment 32, wherein said top mirror comprises another high-contrast grating (HCG).

39. The apparatus of embodiment 32, wherein length of said internal cavity changes in response to changing distance of said separation to support different repetition rates of the passively mode-locked vertical cavity surface emitting laser (VCSEL).

40. The apparatus of embodiment 32, wherein said optically absorbing structure layer comprises any combination of quantum well and/or quantum dots.

41. The apparatus of embodiment 32, wherein at least one said optically absorbing structure layer is incorporated between layers of said high index of refraction cladding within each of said grating elements.

42. The apparatus of embodiment 32, wherein at least one said optically absorbing structure is incorporated on the surface of said grating elements.

43. The apparatus of embodiment 32, wherein said high-contrast grating elements are chirped by varying grating element width and/or spacing along a length and/or distribution direction of said high-contrast grating elements to provide varying phase changes along a length of said high-contrast grating.

44. The apparatus of embodiment 32, wherein said optically absorbing layer inside said high-contrast grating of said apparatus is configured to overlap areas which have an electrical field yielding a desired saturation fluence, at which pulse energy absorption is saturated.

45. The apparatus of embodiment 32, wherein said optically absorbing layer inside said high-contrast grating of said apparatus is configured to overlap areas of highest electrical field to reduce associated saturation fluence, at which pulse energy absorption is saturated.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Mode Formulation both Inside and Outside HCG

| | Inside HCG ($-t_g < z < 0$) | | Outside HCG ($0 < z < -t_g$) | |
|---|---|---|---|---|
| ($0 < x < a$) Mode profiles inside inter-bar air-gaps: ($m = 0, 1, 2, \ldots$) | $\epsilon_p \cos(k_{s,m} s/2) * \cos[k_{a,m}(x - a/2)]$ $\exp(\pm j\beta_m z)\hat{1}_\perp$ symmetric around centers of air-gaps: ($x = a/2$) | (1) | $z < -t_g$ Incident plane-wave: | $\exp(-j2\pi z/\lambda)\vec{\rho}_\perp$ (3) — |
| ($a < x < \Lambda$) Mode profiles inside grating bars: ($m = 0, 1, 2, \ldots$) | $\cos(k_{a,m} a/2)$ $\cos\{k_{s,m} [x - (a + s/2)]\}$ $\exp(\pm j\beta_m z)\vec{\rho}_\perp$ symmetric around centers of bars: ($x = a + s/2$) | (2) | $z < -t_g$ Reflected modes: ($n = 0, 1, 2, \ldots$) $z > 0$ Transmitted modes: ($n = 0, 1, 2, \ldots$) | $\cos[2\pi n(x - a/2)/\Lambda] *$ (4) $\exp[j\gamma_n (z + t_g)]\vec{\rho}_\perp$ $\cos[2\pi n(x - a/2)/\Lambda] *$ (5) $\exp(-j\gamma_n z)\vec{\rho}_\perp$ |
| Dispersion relations inside HCG: $k_{a,m}^2 = (2\pi/\lambda)^2 - \beta_m^2$ $k_{s,m}^2 = (2\pi/\lambda)^2 \epsilon_r - \beta_m^2$ $k_{s,m} \tan(k_{s,m} s/2) = -\epsilon_p k_{a,m} \tan(k_{a,m} a/2)$ | | (6) (7) (8) | Dispersion relations outside HCG: $\gamma_n^2 = (2\pi/\lambda)^2 - (2\pi/\Lambda)^2$ | (9) |

Notations:
$\epsilon_p^2 = n_r^2$, $\epsilon_p = n_r^2$ for TM and 1 for TE, $\hat{1}_\perp = \hat{x}$ for TM and $\hat{y}$ for TE.

TABLE 2

Derivation of the Reflectivity Matrix (R) of HCG

Field Overlap Matrices for electric ($E_{n,m}$) and magnetic ($H_{n,m}$) fields $E_{n,m}$ for TM, or $H_{n,m}$ for TE = (10)

$\Lambda^{-1} \int_0^a \epsilon_p \cos(k_{s,m} s/2) \cos[k_{a,m}(x - a/2)] \cos[2\pi n(x - a/2)/\Lambda] dx +$ $\Lambda^{-1} \int_a^\Lambda \cos(k_{a,m} a/2) \cos\{k_{s,m}[x - (a + \Lambda)/2]\} \cos[2\pi n(x - a/2)/\Lambda] dx$ $H_{n,m}$ for TM, or $E_{n,m}$ for TE = (11)

$(\Lambda \eta_{n,m})^{-1} \int_0^a \epsilon_p \cos(k_{s,m} s/2) \cos[k_{a,m}(x - a/2)] \cos[2\pi n(x - a/2)/\Lambda] dx +$ $(\Lambda \eta_{n,m})^{-1} \int_a^\Lambda \cos(k_{a,m} a/2) \cos\{k_{s,m}[x - (a + \Lambda)/2]\} \cos[2\pi n(x - a/2)/\Lambda] dx$ TABLE 2-continued Derivation of the Reflectivity Matrix (R) of HCG

| Normalized wave impedance: | $\eta_{n,m} = \beta_m/\gamma_n$ for TM, and $\eta_{n,m} = \gamma_n/\beta_m$ for TE | |
|---|---|---|
| HCG output plane reflection matrix: | $\rho = (H + E)^{-1} (H - E)^{-1}$ | (12) |
| Phase matrix: | $\phi_{m,m} = \exp(-j\beta_m t_g)$; $\phi_{m,k} = 0$ for $m \neq k$ | (13) |
| Normalized entrance impedance: | $Z_{in} = E(I + \phi\rho\phi)(I - \phi\rho\phi)^{-1} H^{-1}$; $I$ = unity matrix | (14) |
| External reflectivity matrix: | $R = (Z_{in} + I)^{-1} (Z_{in} - I)$ | (15) |

What is claimed is:

1. A semiconductor saturable absorber mirror apparatus, comprising:
   a high-contrast grating (HCG) having grating elements with an index of refraction at or exceeding approximately two (2);
   said high-contrast grating elements having subwavelength dimensions, in grating element width and spacing;
   a low index of refraction material, or materials, surrounding said grating elements; and
   at least one layer of optically absorbing structures buried within each of said grating elements within said high-contrast grating.

2. The apparatus recited in claim 1, wherein said optically absorbing structures comprise any combination of quantum wells, wires and/or dots.

3. The apparatus recited in claim 1, wherein said optically absorbing structures have a reduced absorption of light with increasing incident light intensity.

4. The apparatus recited in claim 1, wherein said at least one layer of optically absorbing structures are incorporated between high index of refraction cladding layers within each of said grating elements.

5. The apparatus recited in claim 1, wherein said at least one layer of optically absorbing structures are incorporated on the surface of said grating elements.

6. The apparatus recited in claim 1, wherein said grating elements are periodically spaced.

7. The apparatus recited in claim 1, wherein said grating elements are configured of varying width and/or spacing along their length and/or distribution direction to provide a lensing effect.

8. The apparatus recited in claim 1, wherein said high-contrast grating elements are chirped by varying grating element width and/or spacing along a distribution direction of said high-contrast grating elements to provide varying phase changes along a length of said high-contrast grating.

9. The apparatus recited in claim 1, wherein said optically absorbing layer inside said high-contrast grating of said apparatus is configured for overlapping areas having an electrical field yielding a desired saturation fluence, at which pulse energy the absorption saturates.

10. The apparatus recited in claim 9, wherein said optically absorbing layer inside said high-contrast grating of said apparatus is configured to overlap with areas having the highest electrical field and associated saturation fluence, to reduce the pulse energy at a pulse energy that the absorption saturates.

11. The apparatus recited in claim 1:
wherein three physical parameters control reflectivity of the grating, including period ($\Lambda$), thickness ($t_g$), and duty cycle ($\eta$); and
wherein the duty cycle is defined as a ratio between width of the high index material (s) to its period ($\Lambda$).

12. The apparatus recited in claim 1, wherein said apparatus is configured as a saturable absorber mirror within a laser.

13. The apparatus recited in claim 12, wherein said apparatus is configured as a saturable absorber mirror within a laser configured for generating short optical pulses.

14. The apparatus recited in claim 1, wherein said saturable absorber mirror apparatus is configured to have a desired transmissivity by not cancelling out the zeroeth-transmissive order.

15. The apparatus recited in claim 14, wherein said saturable absorber mirror apparatus having the desired transmissivity is configured for incorporation within a laser configured for generating short optical pulses.

16. The apparatus recited in claim 1, wherein said apparatus is configured as a saturable absorber mirror within a vertical cavity surface emitting laser (VCSEL).

17. The apparatus recited in claim 16, wherein said apparatus is configured as an external saturable absorber mirror.

18. The apparatus recited in claim 1, wherein said apparatus is configured as an integrated saturable absorber mirror within a passively mode-locked vertical cavity surface emitting laser (VCSEL).

19. The apparatus recited in claim 18, wherein said VCSEL is electrically-pumped.

20. An external cavity mode-locked vertical-cavity surface-emitting laser apparatus, comprising:
a high-contrast grating saturable absorber (HCG-SA) having grating elements, with subwavelength dimensions of grating element width and spacing, of a material having an index of refraction at or exceeding approximately 2;
a low index of refraction material, or materials, surrounding said grating elements; and
said HCG-SA having high index of refraction cladding surrounding at least one optically absorbing layer;
a semiconductor active structure disposed in separation from said high-contrast grating saturable absorber, wherein said separation forms part of a vertical cavity;
an active region within said vertical cavity surface emitting laser upon which a lens effect of said HCG-SA is focused; and
a bottom mirror positioned beneath said active region.

21. The apparatus recited in claim 20, wherein said grating elements are configured of varying width and/or spacing along their length and/or distribution direction to provide a lensing effect.

22. The apparatus recited in claim 20, wherein said optically absorbing layer within the HCG-SA absorbs light from the active region of said vertical cavity surface emitting laser (VCSEL).

23. The apparatus recited in claim 20, wherein said bottom mirror comprises a multiple layer distributed Bragg reflector (n-DBR).

24. The apparatus recited in claim 20, wherein said bottom mirror comprises another high-contrast grating (HCG).

25. The apparatus recited in claim 20, wherein external cavity length changes in response to changing distance of said separation to support different repetition rates of the mode-locked vertical cavity surface emitting laser (VCSEL).

26. The apparatus recited in claim 20, wherein said optically absorbing layers comprise any combination of quantum well and/or quantum dots.

27. The apparatus recited in claim 20, wherein said at least one optically absorbing layers are incorporated between high index of refraction cladding layers within each of said grating elements.

28. The apparatus recited in claim 20, wherein said at least one optically absorbing layers is incorporated on the surface of said grating elements.

29. The apparatus recited in claim 20, wherein said high-contrast grating elements are chirped by varying grating element width and/or spacing along a length and/or distribution direction of said high-contrast grating elements to provide varying phase changes along a length of said high-contrast grating.

30. The apparatus recited in claim 20, wherein said optically absorbing layer inside said high-contrast grating of said apparatus is configured to overlap areas which have an electrical field yielding a desired saturation fluence, at which pulse energy absorption is saturated.

31. The apparatus recited in claim 20, wherein said optically absorbing layer inside said high-contrast grating of said apparatus is configured to overlap areas of highest electrical field to reduce associated saturation fluence, at which pulse energy absorption is saturated.

32. A monolithic passively mode-locked vertical cavity surface emitting laser (VCSEL) apparatus, comprising:
a top output mirror;
an active region of a vertical cavity surface emitting laser disposed in separation below a low refractive index material, or materials, which are proximal said top output mirror;
a bottom mirror positioned beneath said active region and comprising a high-contrast grating saturable absorber (HCG-SA) having grating elements with subwavelength dimensions in width and/or spacing, of a material with an index of refraction at or exceeding approximately 2; and
at least one optically absorbing structure layer within said HCG-SA surrounded by high index of refraction cladding;
wherein said top mirror, bottom mirror, active layer, and low index of refraction material or materials, are fabricated into a monolithic VCSEL structure having an internal cavity.

33. The apparatus recited in claim 32, wherein:
said top output mirror comprises a high-contrast grating (HCG) with grating elements, of subwavelength dimensions in width and/or spacing, from a material having an index of refraction at or exceeding approximately 2; and a low index of refraction material, or materials, surrounding said grating elements of said top output mirror.

34. The apparatus recited in claim 32, wherein said grating elements are configured of varying width along their length and/or distribution direction to provide a lensing effect.

35. The apparatus recited in claim 32, wherein said VCSEL is electrically-pumped.

36. The apparatus recited in claim 32, wherein said optically absorbing structure layer within the HCG-SA absorbs light from the active region of said vertical cavity surface emitting laser (VCSEL).

37. The apparatus recited in claim 32, wherein said top mirror comprises a distributed Bragg grating (DBR).

38. The apparatus recited in claim 32, wherein said top mirror comprises another high-contrast grating (HCG).

39. The apparatus recited in claim 32, wherein length of said internal cavity changes in response to changing distance of said separation to support different repetition rates of the passively mode-locked vertical cavity surface emitting laser (VCSEL).

40. The apparatus recited in claim 32, wherein said optically absorbing structure layer comprises any combination of quantum wells, wires and/or dots.

41. The apparatus recited in claim 32, wherein at least one said optically absorbing structure layer is incorporated between layers of said high index of refraction cladding within each of said grating elements.

42. The apparatus recited in claim 32, wherein at least one said optically absorbing structure is incorporated on the surface of said grating elements.

43. The apparatus recited in claim 32, wherein said high-contrast grating elements are chirped by varying grating element width and/or spacing along a length and/or distribution direction of said high-contrast grating elements to provide varying phase changes along a length of said high-contrast grating.

44. The apparatus recited in claim 32, wherein said optically absorbing layer inside said high-contrast grating of said apparatus is configured to overlap areas which have an electrical field yielding a desired saturation fluence, at which pulse energy absorption is saturated.

45. The apparatus recited in claim 32, wherein said optically absorbing layer inside said high-contrast grating of said apparatus is configured to overlap areas of highest electrical field to reduce associated saturation fluence, at which pulse energy absorption is saturated.

* * * * *